United States Patent
Yuan

(10) Patent No.: US 11,237,229 B2
(45) Date of Patent: Feb. 1, 2022

(54) MAGNETIC FIELD SENSING APPARATUS

(71) Applicant: Fu-Te Yuan, New Taipei (TW)

(72) Inventor: Fu-Te Yuan, New Taipei (TW)

(73) Assignee: iSentek Inc., New Taipei (TW)

(*) Notice: Subject to any disclaimer, the term of this patent is extended or adjusted under 35 U.S.C. 154(b) by 129 days.

(21) Appl. No.: 16/884,076

(22) Filed: May 27, 2020

(65) Prior Publication Data

US 2020/0379064 A1 Dec. 3, 2020

Related U.S. Application Data

(60) Provisional application No. 62/853,163, filed on May 27, 2019.

(51) Int. Cl.
*G01R 33/02* (2006.01)
*G01R 33/09* (2006.01)
*G01C 17/28* (2006.01)

(52) U.S. Cl.
CPC .......... *G01R 33/091* (2013.01); *G01C 17/28* (2013.01)

(58) Field of Classification Search
CPC ............................ G01C 17/28; G01R 33/091
See application file for complete search history.

(56) References Cited

U.S. PATENT DOCUMENTS

| 5,561,368 A | 10/1996 | Dovek et al. |
| 8,390,283 B2 | 3/2013 | Mather et al. |
| 2016/0327618 A1 | 11/2016 | Yuan et al. |

FOREIGN PATENT DOCUMENTS

| CN | 1497749 | 5/2004 |
| CN | 105785290 | 2/2019 |
| TW | 468168 | 12/2001 |
| TW | 201329479 | 7/2013 |
| TW | I518349 | 1/2016 |

*Primary Examiner* — Alesa Allgood
(74) *Attorney, Agent, or Firm* — JCIPRNET

(57) ABSTRACT

A magnetic field sensing apparatus including a magnetic flux concentrator, a plurality of single direction magneto-resistive sensors and a time division switching circuit is provided. The magnetic flux concentrator has a plurality of corners. The single direction magneto-resistive sensors have a same pinning direction. The single direction magneto-resistive sensors are respectively disposed beside the corners. The time division switching circuit is coupled to the single direction magneto-resistive sensors, and is configured to switch at least a portion of the junctions between the single direction magneto-resistive sensors to change a circuit connection between the magneto-resistive sensors, thereby forming different Wheatstone bridges being configured to measure different magnetic field components of the external magnetic field in different directions.

12 Claims, 14 Drawing Sheets

MAGNETIC FIELD SENSING APPARATUS

CROSS-REFERENCE TO RELATED APPLICATION

This application claims the priority benefit of U.S. provisional application Ser. No. 62/853,163, filed on May 27, 2019. The entirety of the above-mentioned patent application is hereby incorporated by reference herein and made a part of this specification.

BACKGROUND

Technical Field

The disclosure relates to an electronic apparatus, and particularly relates to a magnetic field sensing apparatus.

Description of Related Art

Along with development of technology, electronic products with navigation and positioning functions are becoming more and more diversified. Electronic compasses provide functions equivalent to functions of traditional compasses in application fields of vehicle navigation, aviation and personal handheld devices. In order to realize the functions of the electronic compass, a magnetic field sensing apparatus becomes a necessary electronic device.

In order to achieve uniaxial sensing, a giant magnetoresistance (GMR) multilayer film structure or a tunneling magnetoresistance (TMR) multilayer film structure may generally used to constitute a Wheatstone full bridge, and pinning directions of these magnetoresistance multilayer film structures are designed into two opposite and parallel pinning directions. For example, in order to achieve three-axis sensing, six pinning directions that are opposite and parallel with each other in pairs are required. However, to design different pinning directions on an antiferromagnetic layer of a wafer may cause manufacturing difficulties, which results in additional costs, and reduces stability of a pinning layer.

SUMMARY

The disclosure is directed to a magnetic field sensing apparatus, which is simple in manufacturing, low in production cost and has good stability.

An embodiment of the disclosure provides a magnetic field sensing apparatus including a magnetic flux concentrator, a plurality of single direction magneto-resistive sensors and a time division switching circuit. The magnetic flux concentrator has a plurality of corners. The single direction magneto-resistive sensors have a same pinning direction. The single direction magneto-resistive sensors are respectively disposed beside the corners. A reference axis parallel to one side of the magnetic flux concentrator is defined. A first acute angle is formed between easy magnetization axes of the single direction magneto-resistive sensors and the reference axis. The time division switching circuit is coupled to the single direction magneto-resistive sensors, and is configured to switch at least a portion of junctions between the single direction magneto-resistive sensors within different time intervals to change a circuit connection between the single direction magneto-resistive sensors, so as to form different Wheatstone bridges in different time intervals to measure magnetic field components of an external magnetic field in different directions.

In an embodiment of the disclosure, the magnetic flux concentrator includes a plurality of sides. The sides include a first side, a second side, a third side, and a fourth side. The first side is opposite to the third side, and the second side is opposite to the fourth side. The first side is respectively connected to the second side and the fourth side to respectively form a first corner and a second corner of the corners. The third side is respectively connected to the second side and the fourth side to respectively form a third corner and a fourth corner of the corners. The first corner and the fourth corner are diagonal to each other, and the second corner and the third corner are diagonal to each other.

In an embodiment of the disclosure, the single direction magneto-resistive sensors are divided into a first portion and a second portion. The first portion includes two of the single direction magneto-resistive sensors located beside the first corner and the second corner, and axial directions of all of the easy magnetization axes thereof are parallel to each other. The second portion includes two of the single direction magneto-resistive sensors located beside the third corner and the fourth corner, and axial directions of all of the easy magnetization axes thereof are parallel to each other. The axial directions of the easy magnetization axes of all of the single direction magneto-resistive sensors of the first portion are a first axial direction. The axial directions of the easy magnetization axes of all of the single direction magneto-resistive sensors of the second portion are a second axial direction. The first axial direction is not parallel with the second axial direction.

In an embodiment of the disclosure, the axial directions of the easy magnetization axes of the single direction magneto-resistive sensors are parallel with each other.

In an embodiment of the disclosure, the axial direction of the easy magnetization axe of the single direction magneto-resistive sensor is an extending direction of the single direction magneto-resistive sensor.

In an embodiment of the disclosure, the first acute angle ranges between 20 degrees and 70 degrees.

In an embodiment of the disclosure, in a first time interval, the time division switching circuit connects one end of the first single direction magneto-resistive sensor to one end of the third single direction magneto-resistive sensor, connects another end of the first single direction magneto-resistive sensor to one end of the fourth single direction magneto-resistive sensor, and connects one end of the second single direction magneto-resistive sensor to another end of the third single direction magneto-resistive sensor, and connects another end of the second single direction magneto-resistive sensor to another end of the fourth single direction magneto-resistive sensor to form a first Wheatstone bridge, and the first Wheatstone bridge is configured to measure a magnetic field component of the external magnetic field in a first direction.

In an embodiment of the disclosure, in a second time interval, the time division switching circuit connects one end of the first single direction magneto-resistive sensor to one end of the second single direction magneto-resistive sensor, connects another end of the first single direction magneto-resistive sensor to one end of the fourth single direction magneto-resistive sensor, and connects one end of the third single direction magneto-resistive sensor to another end of the second single direction magneto-resistive sensor, and connects another end of the third single direction magneto-resistive sensor to another end of the fourth single direction magneto-resistive sensor to form a second Wheatstone bridge, and the second Wheatstone bridge is configured to measure a magnetic field component of the external magnetic field in a second direction.

In an embodiment of the disclosure, in a third time interval, the time division switching circuit connects one end of the first single direction magneto-resistive sensor to one end of the second single direction magneto-resistive sensor, connects another end of the first single direction magneto-resistive sensor to one end of the third single direction magneto-resistive sensor, and connects one end of the fourth single direction magneto-resistive sensor to another end of the second single direction magneto-resistive sensor, and connects another end of the fourth single direction magneto-resistive sensor to another end of the third single direction magneto-resistive sensor to form a third Wheatstone bridge, and the third Wheatstone bridge is configured to measure a magnetic field component of the external magnetic field in a third direction.

In an embodiment of the disclosure, a second acute angle is formed between the axial direction of the easy magnetization axis and the pinning direction.

In an embodiment of the disclosure, the axial direction of the easy magnetization axis and the pinning direction are perpendicular to each other.

In an embodiment of the disclosure, the single direction magneto-resistive sensors include giant magneto-resistive sensors or tunneling magneto-resistive sensors.

Based on the above description, in the magnetic field sensing apparatus of the embodiment of the disclosure, since the pinning directions of the single direction magneto-resistive sensors are all in the same direction, the magnetic field sensing apparatus has simple manufacturing process, low cost and good stability. Moreover, the time division switching circuit in the magnetic field sensing apparatus may couple the single direction magneto-resistive sensors located beside the corners of the magnetic flux concentrator into different Wheatstone bridges in different time intervals to measure magnetic field components of the external magnetic field in different directions. Since lines of the different Wheatstone bridges may stride over the magnetic flux concentrator itself, the magnetic field sensing apparatus may have a smaller volume.

DESCRIPTION OF THE EMBODIMENTS

In order to facilitate describing a configuration of a magnetic field sensing apparatus of an embodiment of the disclosure, the magnetic field sensing apparatus may be regarded as being in a space constructed by directions D1, D2 and D3, and the above directions D1, D2 and D3 are perpendicular to each other in pairs.

Figure 1:
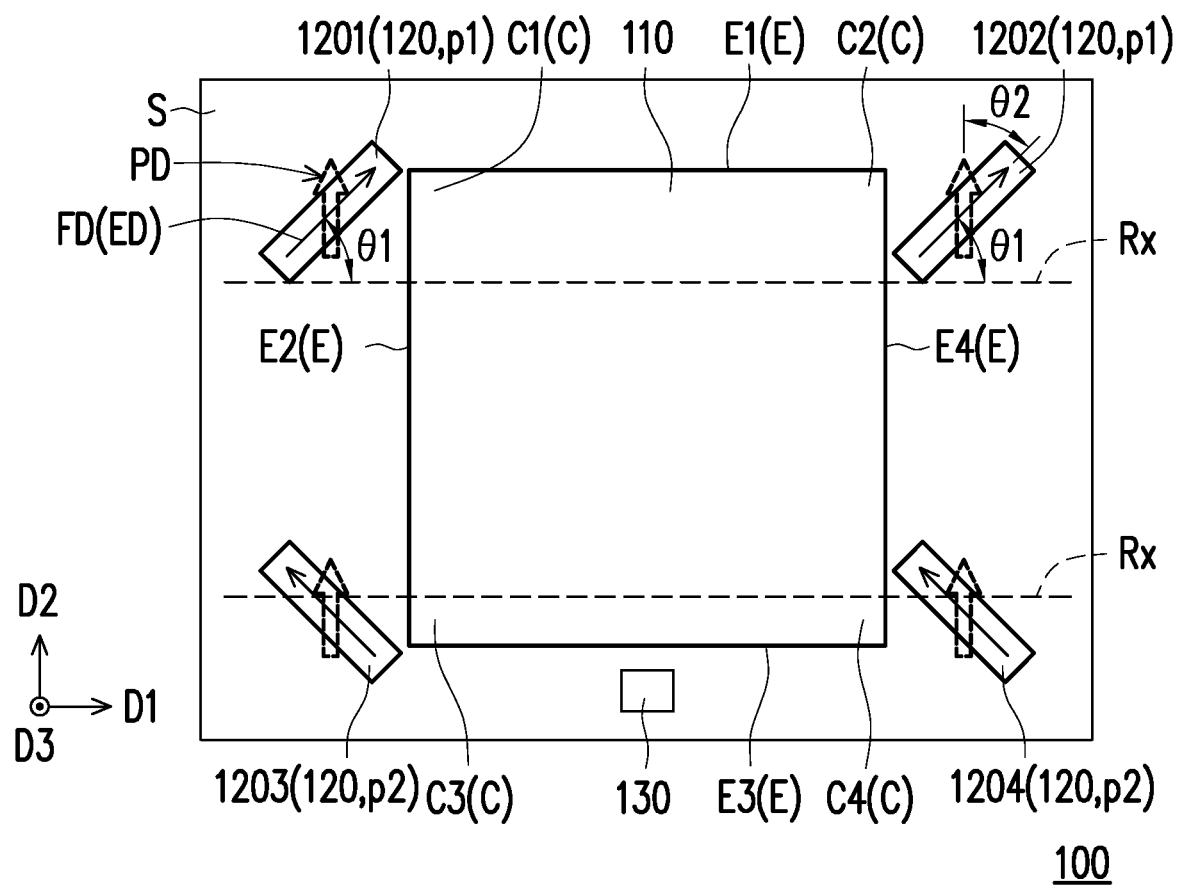
FIG. 1 is a structural schematic top view of a magnetic field sensing apparatus according to an embodiment of the disclosure.
Figure 2A:
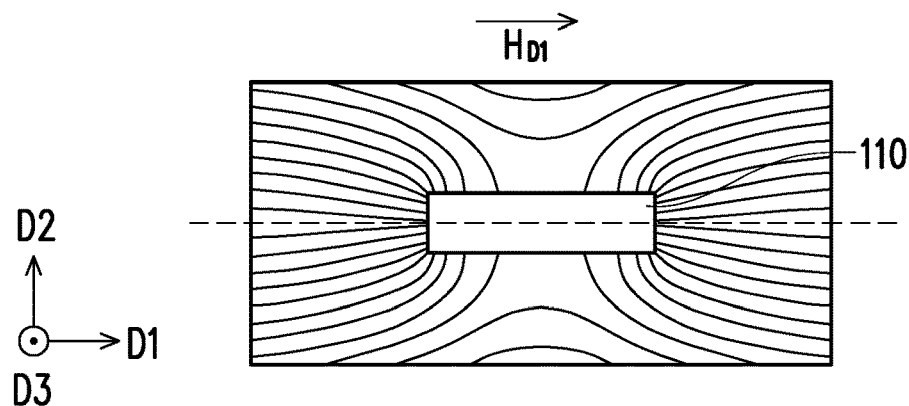
FIG. 2A, FIG. 2B and FIG. 2C are respectively simulation diagrams of magnetic lines of an external magnetic field changed by a magnetic flux concentrator when the external magnetic fields of different directions are applied to the magnetic field sensing apparatus of FIG. 1.
Figure 2B:
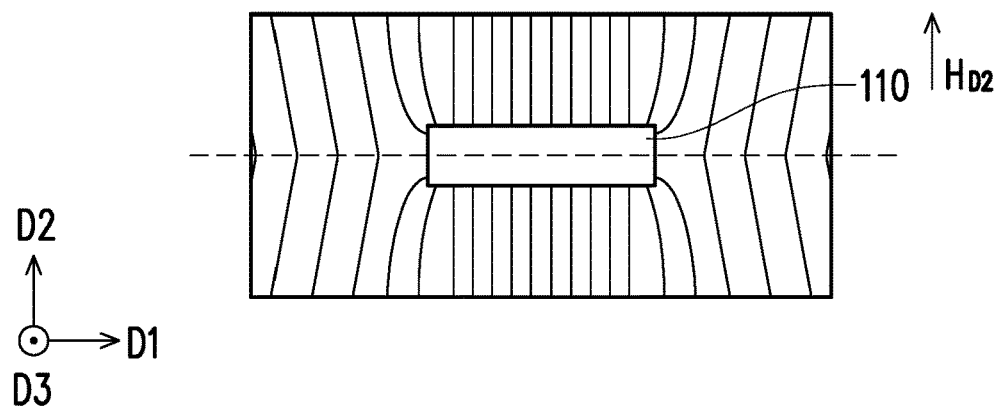
Figure 2C:
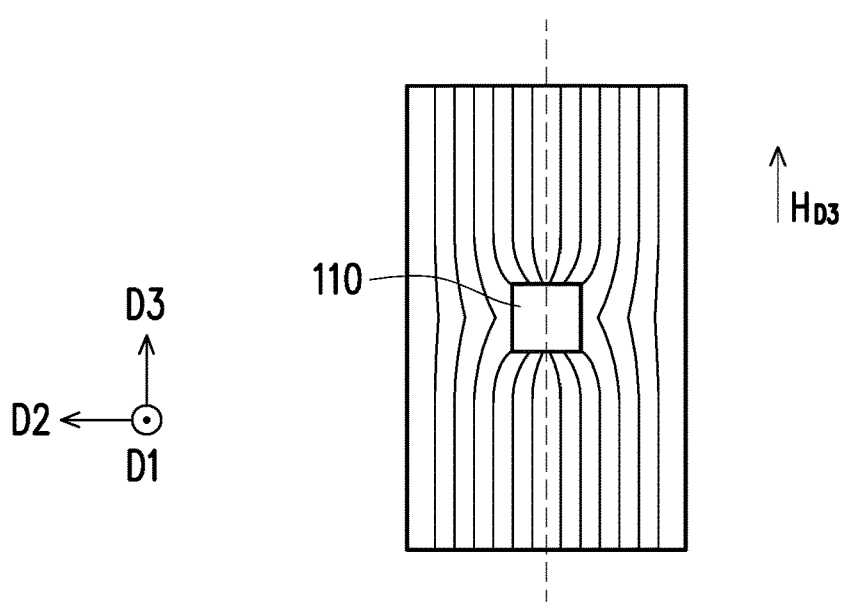
Figure 3A:
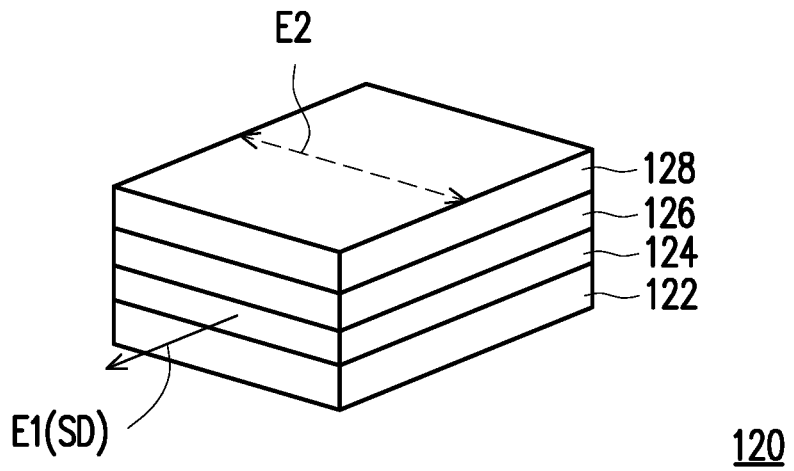
FIG. 3A is a schematic three-dimensional view of a multilayer film structure of a single direction magneto-resistive sensor in FIG. 1.
Figure 3B:
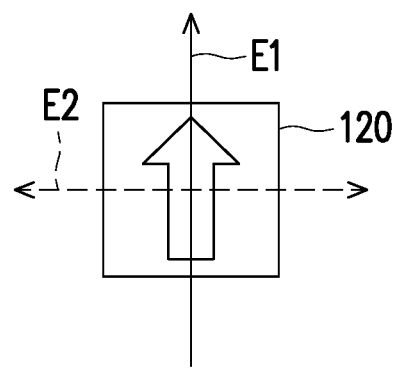
FIG. 3B illustrates a pinning direction of the single direction magneto-resistive sensor of FIG. 3A and an easy magnetization axis of a free layer.
Figure 3C:
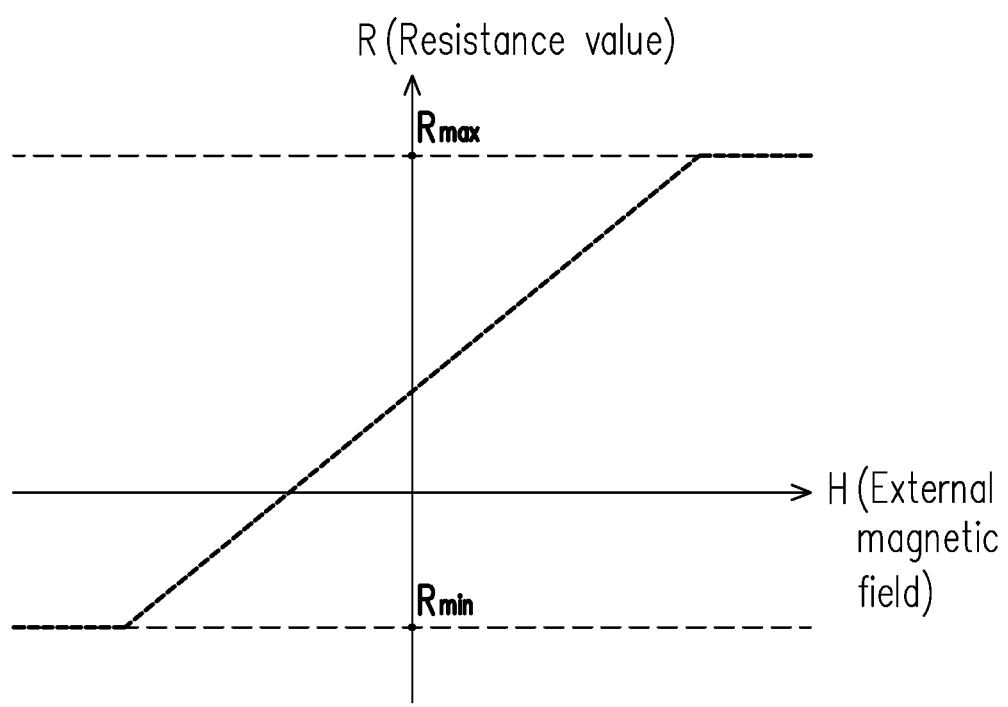
FIG. 3C illustrates a change in resistance of the single direction magneto-resistive sensor of FIG. 3A under an effect of the external magnetic fields of different directions and in the absence of the external magnetic field.

FIG. 1 is a structural schematic top view of a magnetic field sensing apparatus according to an embodiment of the disclosure. FIG. 2A, FIG. 2B and FIG. 2C are respectively simulation diagrams of magnetic lines of external magnetic fields changed by a magnetic flux concentrator when the external magnetic fields of different directions are applied to the magnetic field sensing apparatus of FIG. 1. FIG. 3A is a schematic three-dimensional view of a multilayer film structure of a single direction magneto-resistive sensor in FIG. 1. FIG. 3B illustrates a pinning direction of the single direction magneto-resistive sensor of FIG. 3A and an easy magnetization axis of a free layer. FIG. 3C illustrates a change in resistance of the single direction magneto-resistive sensor of FIG. 3A under an effect of the external magnetic fields of different directions and in the absence of the external magnetic field.

Referring to FIG. 1, in the embodiment, a magnetic field sensing apparatus 100 includes a substrate S, a magnetic flux concentrator 110, a plurality of single direction magneto-resistive sensors 120 and a time division switching circuit 130. The above devices are described in detail in following paragraphs.

In the embodiment of the disclosure, the substrate S is, for example, a blank silicon substrate, a glass substrate or a silicon substrate with an integrated circuit, which is not limited by the disclosure.

In the embodiment of the disclosure, the magnetic flux concentrator 110 refers to a device that may concentrate or bend magnetic lines of a magnetic field. A material of the magnetic flux concentrator 110 is, for example, a ferromagnetic material with high magnetic permeability, such as nickel-iron alloy, cobalt iron or cobalt-iron-boron alloy, ferrite magnet or other materials with high magnetic permeability, but the disclosure is not limited thereto. Referring to FIG. 2A to FIG. 2C, these figures show distributions of magnetic lines when the magnetic flux concentrator 110 is placed in external magnetic fields $H_{D1}$, $H_{D2}$ and $H_{D3}$ of different directions D1-D3, from which it is learned that the magnetic flux concentrator 110 may concentrate or bend the magnetic lines of the external magnetic fields $H_{D1}$, $H_{D2}$ and $H_{D3}$.

In the embodiment of the disclosure, the single direction magneto-resistive sensors 120 refer to sensors whose resistances may be changed along with a change of the external magnetic field, and types thereof include giant magneto-resistive sensors or tunneling magneto-resistive sensors. In the embodiment, the number of the single direction magneto-resistive sensors 120 is, for example, four, but the disclosure is not limited thereto.

Referring to FIG. 3A to FIG. 3C, in the embodiment, the single direction magneto-resistive sensor 120 includes a pinning layer 122, a pinned layer 124, a spacer layer 126 and a free layer 128. The pinning layer 122 fixes a magnetization direction of the pinned layer 124, which is a pinning direction E1, and a direction of an easy magnetization axis FD of the free layer 128 may be substantially perpendicular to the pinning direction E1. When the single direction magneto-resistive sensor 120 is a giant magneto-resistive sensor, a material of the spacer layer 126 is non-magnetic metal. Moreover, when the single direction magneto-resistive sensor 120 is a tunneling magneto-resistive sensor, the material of the spacer layer 126 is an insulating material. Referring to FIG. 1, it should be noted that in the embodiment, the so-called "single direction" refers to that the pinning directions PD of the magneto-resistive sensors 120 are in the same direction, which is, for example, the direction D2.

The graph in FIG. 3C shows a change of a resistance value R of the single direction magneto-resistive sensor 120 with respect to the external magnetic field H. Referring to FIG. 3A to FIG. 3C, when an included angle between the pinning direction PD of the single direction magneto-resistive sensor 120 and the easy magnetization axis FD is 90 degrees, and the resistance value is $R_0$. When the single direction magneto-resistive sensor 120 is placed in an external magnetic field, the easy magnetization axis FD may be affected by the external magnetic field and rotated toward the external magnetic field. If the direction of the external magnetic field is between the pinning direction PD and an original axial direction of the easy magnetization axis FD, the axial direction of the easy magnetization axis FD may be rotated toward the pinning direction PD to reduce the included angle there between, i.e., the included angle is changed from the original 90 degrees to an angle less than 90 degrees, at this point, the resistance value R may be dropped to $R0-\Delta R$, where $\Delta R$ is greater than 0. If the direction of the external magnetic field is outside the pinning direction PD and the original axial direction of the easy magnetization axis FD, the axial direction of the easy magnetization axis FD may be rotated away from the pinning direction PD to increase the included angle there between, i.e., the included angle is changed from the original 90 degrees to an angle greater than 90 degrees, at this point, the resistance value R may be increased to $R0+\Delta R$. If the direction of the external magnetic field is exactly the original axial direction of the easy magnetization axis FD, the axial direction of the easy magnetization axis FD is not deflected, and the included angle there between is not increased, at this point, the resistance value R is not changed.

The time division switching circuit 130 is coupled to the single direction magneto-resistive sensors 120, and is configured to switch at least a portion of junctions between the single direction magneto-resistive sensors 120 to change a circuit connection between the single direction magneto-resistive sensors 120.

After briefly introducing the functions of the aforementioned devices, a configuration relationship between the devices is explained in detail in the following paragraphs.

Referring to FIG. 1, viewed from a top view, a shape of the magnetic flux concentrator 110 of the embodiment is substantially a square, but the disclosure is not limited to thereto. The magnetic flux concentrator 110 has a plurality of sides E, which are respectively referred to as a first side to a fourth side E1-E4, the first side E1 is opposite to the third side E3, the second side E2 is opposite to the fourth side E4, and the first side E1 is connected to the second and fourth sides E2 and E4, the second side E2 is connected to the first and third sides E1 and E3, the third side E3 is connected to the second and fourth sides E2 and E4, and the fourth side E4 is connected to the first and third sides E1 and E3. Moreover, the magnetic flux concentrator 110 has a plurality of corners C. Any two adjacent sides E construct a corner C, where the first side E1 and the second side E2 construct a corner C1, the first side E1 and the fourth side E4 construct a corner C2, the second side E2 and the third side E3 construct a corner C3, and the third side E3 and the fourth side E4 construct a corner C4, where the corners C1 and C4 are diagonal to each other, and the corners C2 and C3 are diagonal to each other.

Referring to FIG. 1, the single direction magneto-resistive sensors 120 are respectively disposed beside the four corners C of the magnetic flux concentrator 110, and the single direction magneto-resistive sensors 120 located beside the corners C1-C4 are respectively referred to as first to fourth single direction magneto-resistive sensors 1201-1204. The single direction magneto-resistive sensors 120 have the same pinning direction PD, where the pinning direction PD is, for example, parallel to the direction D2. Moreover, viewed from a top view, a shape of the single direction magneto-resistive sensor 120 of the embodiment is substantially a rectangle, and an extending direction ED of a long side in appearance is, for example, the direction of the easy magnetization axis FD, and the easy magnetization axes FD of the single direction magneto-resistive sensors 120 are all the same. A reference axis RX parallel to a long side LE of the magnetic flux concentrator 110 is defined, and an acute angle θ1 is formed between the easy magnetization axis FD of each of the single direction magneto-resistive sensors 120 and the reference axis RX, where the acute angle θ1 ranges between 20 degrees and 70 degrees. Moreover, in each single direction magneto-resistive sensor 120, an acute angle θ2 is also formed between the direction of the easy magnetization axis FD and the pinning direction PD.

To be more specific, if the single direction magneto-resistive sensors 120 are divided into a first portion P1 and a second portion P2, the first portion P1 includes the first and second single direction magneto-resistive sensors 1201 and 1202 located beside the first and second corners C1 and C2, and the second portion P2 includes the third and fourth single direction magneto-resistive sensors 1203 and 1204 located beside the third and fourth corners C3 and C4. In the first portion P1, an axial direction (or referred to as a first axial direction) of the easy magnetization axes FD of the first and second single direction magneto-resistive sensors 1201 and 1202 is, for example, a right-up diagonal direction between the direction D1 and the direction D2. In the second portion P2, the axial direction (or referred to as a second axial direction) of the easy magnetization axes FD of the third and fourth single direction magneto-resistive sensors 1203 and 1204 is, for example, a left-up diagonal direction between the direction D1 and the direction D2. The first axial direction is not parallel to the second axial direction.

Referring back to FIG. 1, the magnetic flux concentrator 110, the single direction magneto-resistive sensors 120 and the time division switching circuit 130 are all integrated in the substrate S, and the time division switching circuit 130 is coupled to the single direction magneto-resistive sensors 120.

After describing the configuration of the above devices, how the magnetic field sensing apparatus 100 measures magnetic field components of different directions is described in detail in the following paragraphs.

Figure 4A:
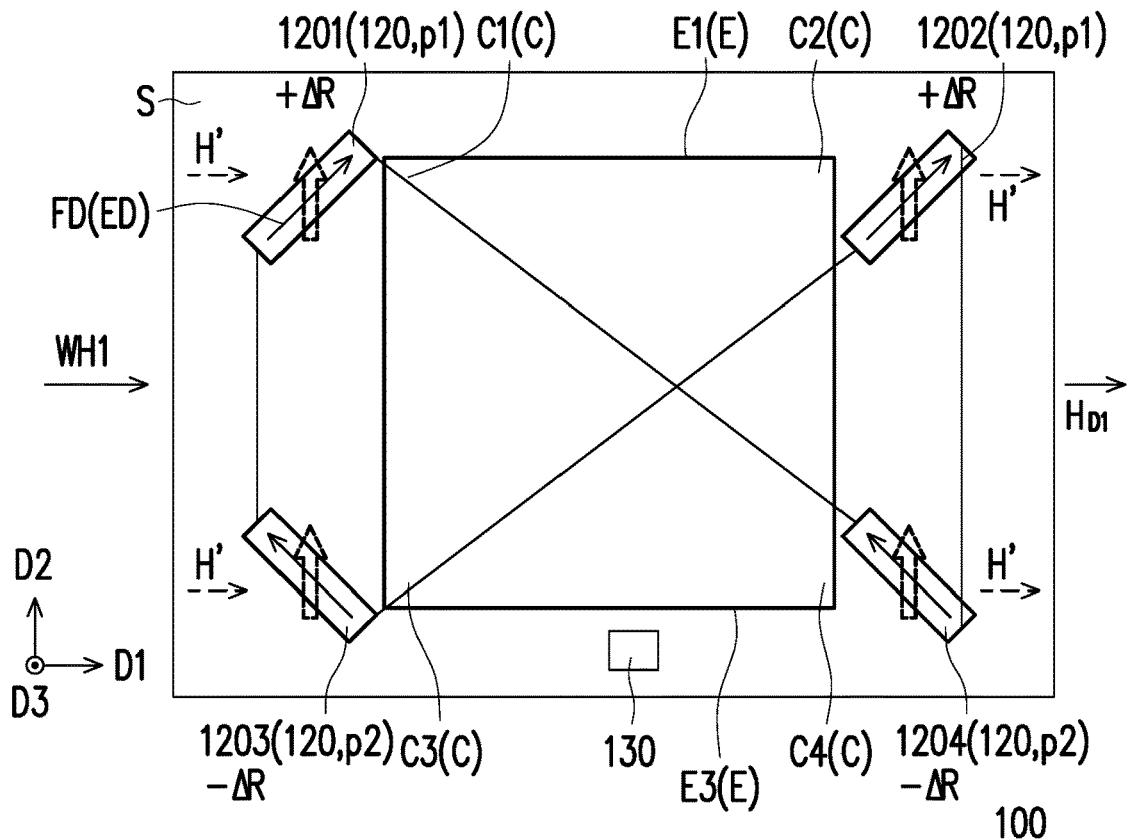
FIG. 4A to FIG. 4C are schematic diagrams of the magnetic field sensing apparatus of FIG. 1 placed in external magnetic fields of different directions in a first time interval.
Figure 4B:
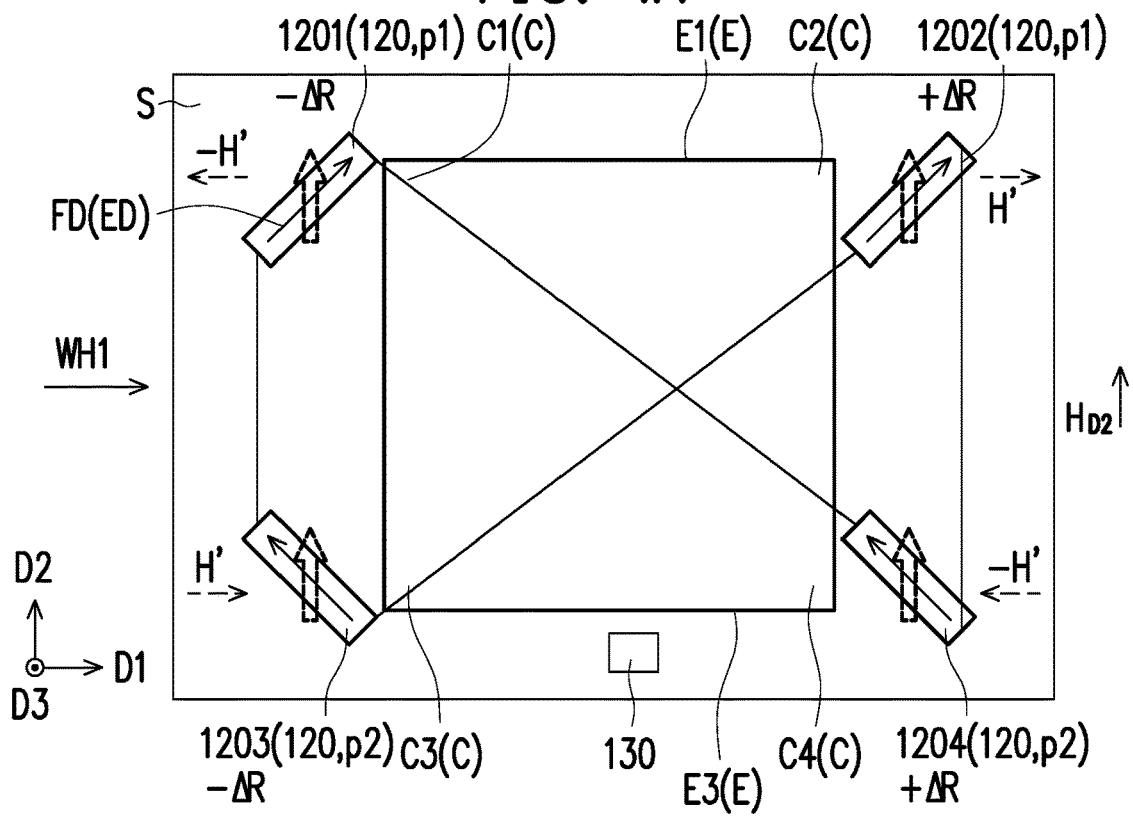
Figure 4C:
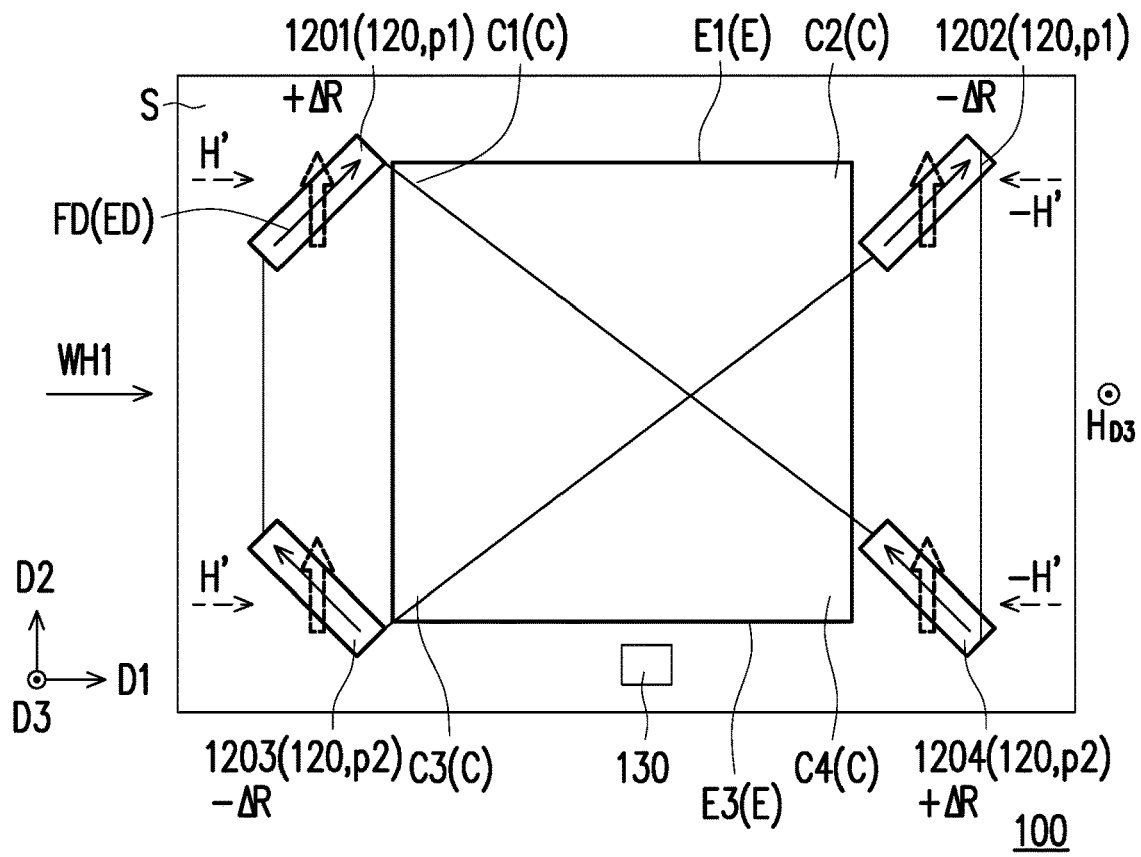
Figure 4D:
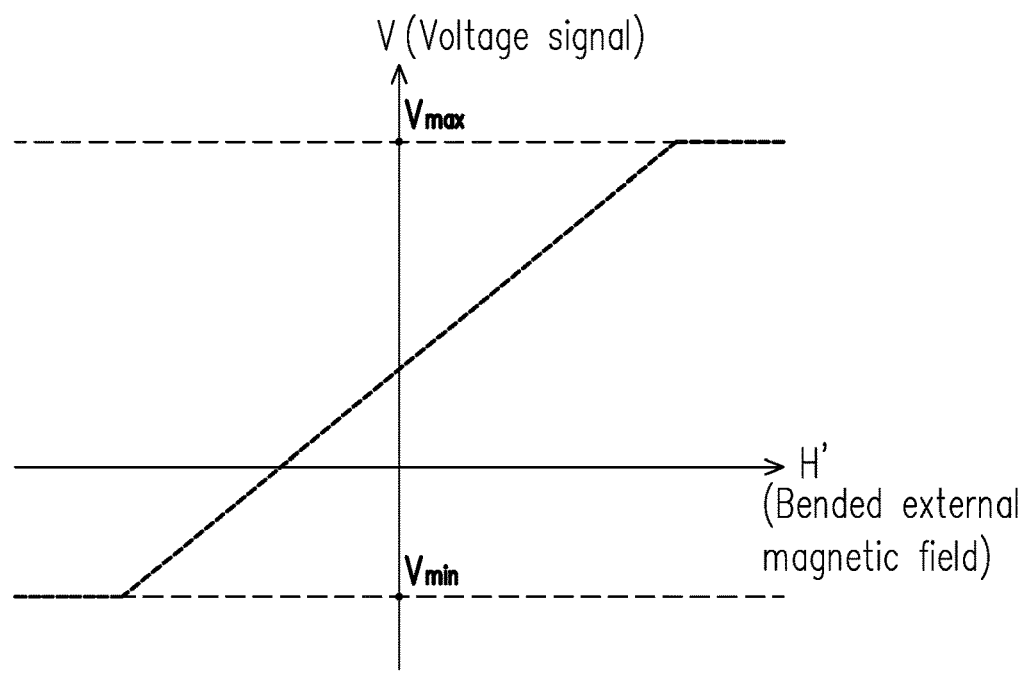
FIG. 4D is a diagram illustrating a relationship between a magnitude of an external magnetic field and a voltage signal output by a first Wheatstone bridge when the magnetic field sensing apparatus of FIG. 1 is placed in the external magnetic field of a first direction.

FIG. 4A to FIG. 4C are schematic diagrams of the magnetic field sensing apparatus of FIG. 1 placed in external magnetic fields of different directions in a first time interval. FIG. 4D is a diagram illustrating a relationship between a magnitude of an external magnetic field and a voltage signal output by a first Wheatstone bridge when the magnetic field sensing apparatus of FIG. 1 is placed in the external magnetic field of the first direction.

Referring to FIG. 4A to FIG. 4C, in the first time interval, the single direction magneto-resistive sensors 120 are coupled into a first Wheatstone bridge WH1 by the time division switching circuit 130. In detail, each single direction magneto-resistive sensor 120 has two opposite ends, and in the first Wheatstone bridge WH1, one end of the first single direction magneto-resistive sensor 1201 is connected to one end of the third single direction magneto-resistive sensor 1203, the other end of the first single direction magneto-resistive sensor 1201 is connected to one end of the fourth single direction magneto-resistive sensor 1204. One end of the second single direction magneto-resistive sensor 1202 is connected to the other end of the third single direction magneto-resistive sensor 1203, and the other end of the second single direction magneto-resistive sensor 1202 is connected to the other end of the fourth single direction magneto-resistive sensor 1204.

Then, in the following paragraphs, reactions of the first Wheatstone bridge WH1 in the external magnetic fields $H_{D1}$, $H_{D2}$, and $H_{D3}$ of different directions are substantially described according to the structure of the first Wheatstone bridge WH1.

Referring to FIG. 2A and FIG. 4A together, when the magnetic field sensing apparatus 100 is placed in the external magnetic field $H_{D1}$ with a magnetic field direction of the direction D1, the external magnetic field $H_{D1}$ may form a bended external magnetic field H' due to the influence of the magnetic flux concentrator 110. In the positions of the single direction magneto-resistive sensors 120, the direction of the bended external magnetic field H' is substantially not changed by the magnetic flux concentrator 110, so that the single direction magneto-resistive sensors 120 all sense the magnetic field of the same direction.

Further, in the right-up diagonal direction of the easy magnetization axes FD of the single direction magneto-resistive sensors 1201 and 1202 in the first portion P1, when the single direction magneto-resistive sensors 1201 and 1202 are in the external magnetic field H' with a direction to the right, the easy magnetization axes FD thereof may be affected by the external magnetic field H' and deflected toward the external magnetic field H'. Therefore, the acute angle θ2 between the pinning direction PD and the easy magnetization axis FD is increased to result in a change of positive ΔR in the resistance value, where ΔR is greater than zero.

Further, in the left-up diagonal direction of the easy magnetization axes FD of the single direction magneto-resistive sensors 1203 and 1204 in the second portion P2, when the single direction magneto-resistive sensors 1203 and 1204 are in the external magnetic field H' with the direction to the right, the easy magnetization axes FD thereof may be affected by the external magnetic field $H_{D1}$ and deflected toward the external magnetic field H'. Therefore, the acute angle θ2 between the pinning direction PD and the easy magnetization axis FD is decreased to result in a change of negative ΔR in the resistance value, where ΔR is greater than zero.

The above description is made in case that the direction of the external magnetic field H' is to the right. If the direction of the external magnetic field H' is to the left, the aforementioned changes in the resistance value are opposite, which are not repeated.

Through the changes of the resistance values of the aforementioned single direction magneto-resistive sensors 120, the first Wheatstone bridge WH1 may output a voltage signal as shown in FIG. 4D. According to FIG. 4D, it is learned that the voltage signal is linearly distributed within a predetermined range of the external magnetic field H'. Within the predetermined range, a calculator (not shown) in the magnetic field sensing apparatus 100 may determine a magnitude and the positive and negative values of the external magnetic field $H_{D1}$ in the direction D1 according to the voltage signal.

Referring to FIG. 2B and FIG. 4B together, when the magnetic field sensing apparatus 100 is placed in the external magnetic field $H_{D2}$ with the magnetic field direction of the direction D2, a bended external magnetic field H' is formed due to a bending effect of the magnetic flux concentrator 110 on the magnetic lines of the external magnetic field $H_{D2}$. The first to fourth single direction magneto-resistive sensors 1201-1204 at different positions may sequentially sense the external magnetic field H' with directions to the left, right, right and left. Therefore, the resistance values of the first to fourth single direction magneto-resistive sensors 1201-1204 sequentially produce changes of the negative ΔR, the positive ΔR, the negative ΔR, and the positive ΔR, where ΔR is greater than zero. Through the changes of the resistance values of the aforementioned single direction magneto-resistive sensors 120, the first Wheatstone bridge WH1 may output another voltage signal, but the another voltage signal is a constant, in other words, the constant voltage signal is not changed along with increase or decrease of the external magnetic field $H_{D2}$, i.e., the first Wheatstone bridge WH1 cannot measure the magnetic field component in the direction D2.

Referring to FIG. 2C and FIG. 4C together, when the magnetic field sensing apparatus 100 is placed in the external magnetic field $H_{D3}$ with the magnetic field direction of the direction D3, a bended external magnetic field H' is formed due to the bending effect of the magnetic flux concentrator 110 on the magnetic lines of the external magnetic field $H_{D3}$. The first to fourth single direction magneto-resistive sensors 1201-1204 at different positions may sequentially sense the external magnetic field H' with directions to the right, left, right and left. Therefore, the resistance values of the first to fourth single direction magneto-resistive sensors 1201-1204 sequentially produce changes of the positive ΔR, the negative ΔR, the negative ΔR, and the positive ΔR, where ΔR is greater than zero. Through the changes of the resistance values of the aforementioned single direction magneto-resistive sensors 120, the first Wheatstone bridge WH1 may output still another voltage signal, but the still another voltage signal is a constant, in other words, the constant voltage signal is not changed along with increase or decrease of the external magnetic field $H_{D3}$, i.e., the first Wheatstone bridge WH1 cannot measure the magnetic field component in the direction D3.

According to the above description, in the first time interval, the time division switching circuit 130 may couple the single direction magneto-resistive sensors 120 into the first Wheatstone bridge WH1 to measure the magnetic field component of the external magnetic field in the first direction D1.

Figure 5A:
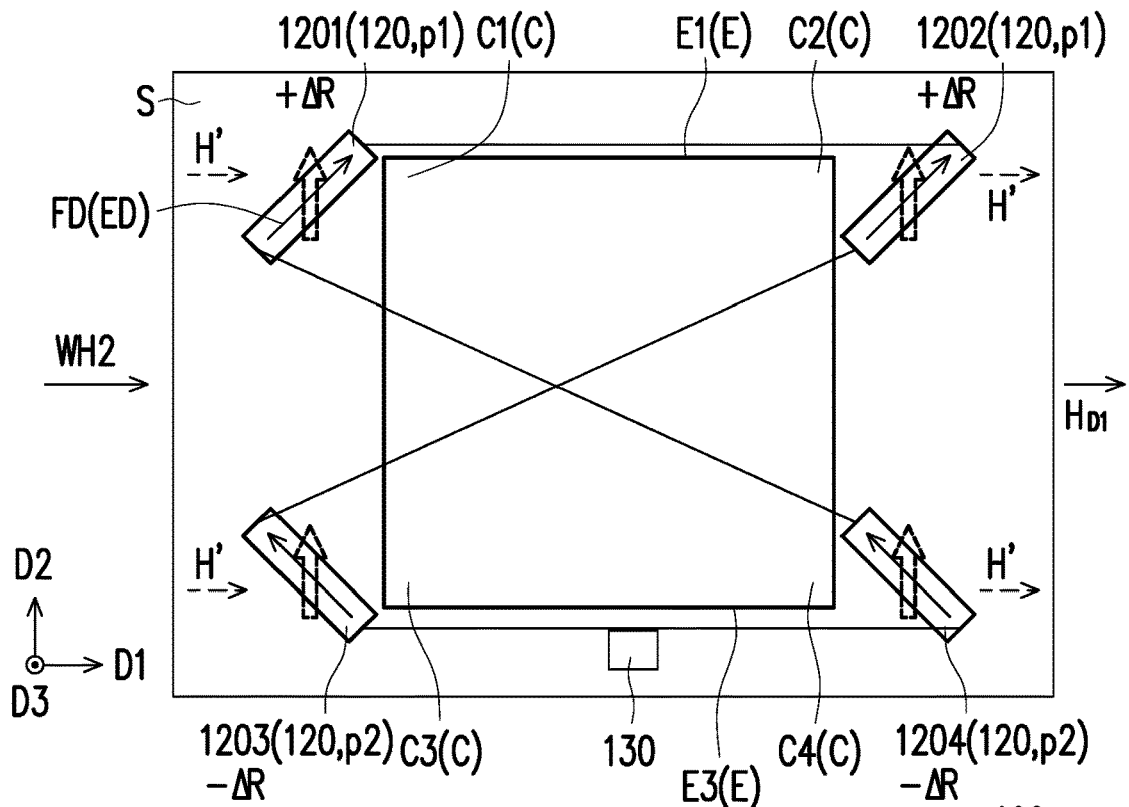
FIG. 5A to FIG. 5C are schematic diagrams of the magnetic field sensing apparatus of FIG. 1 placed in external magnetic fields of different directions in a second time interval.
Figure 5B:
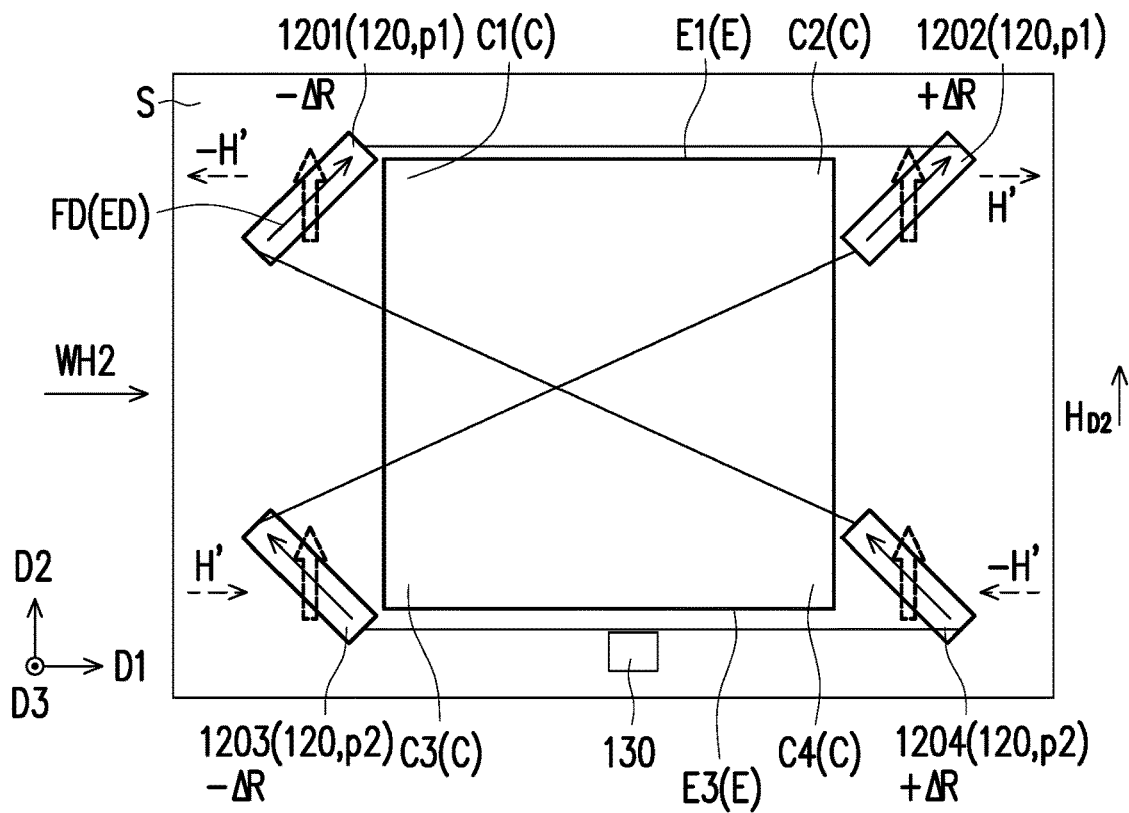
Figure 5C:
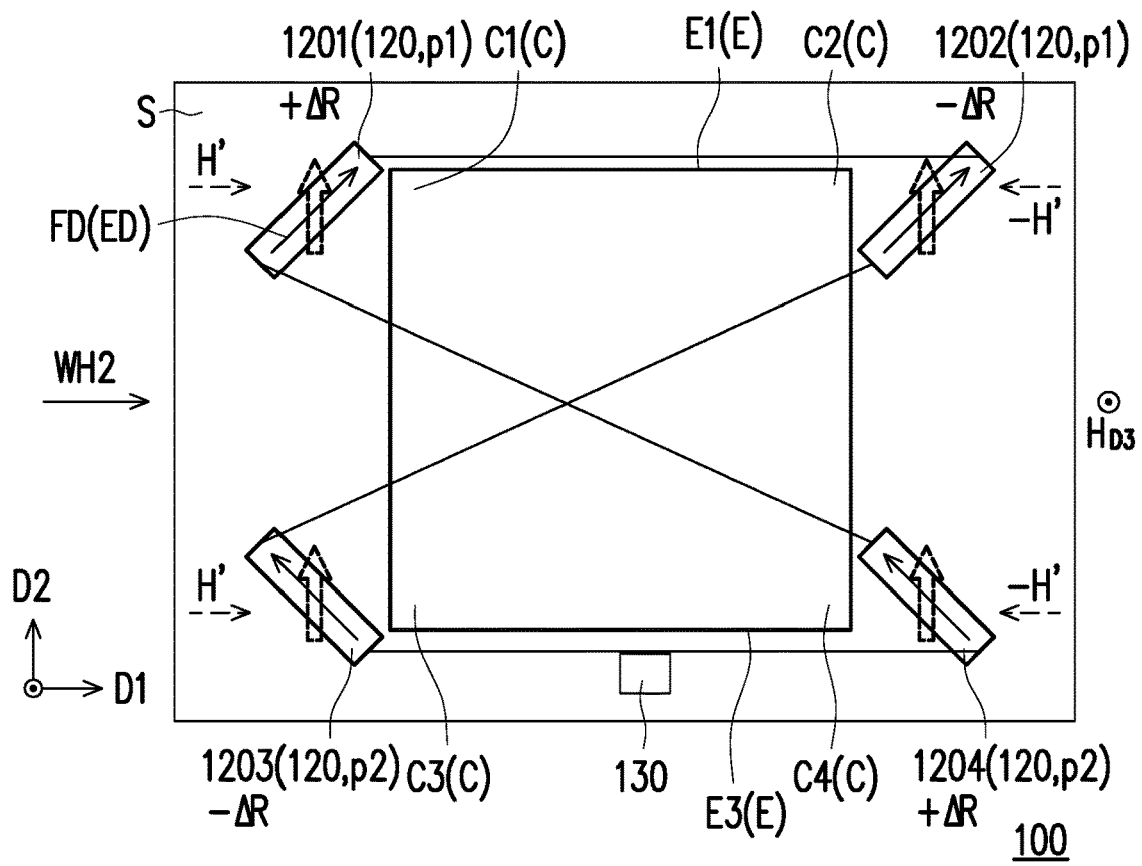
Figure 5D:
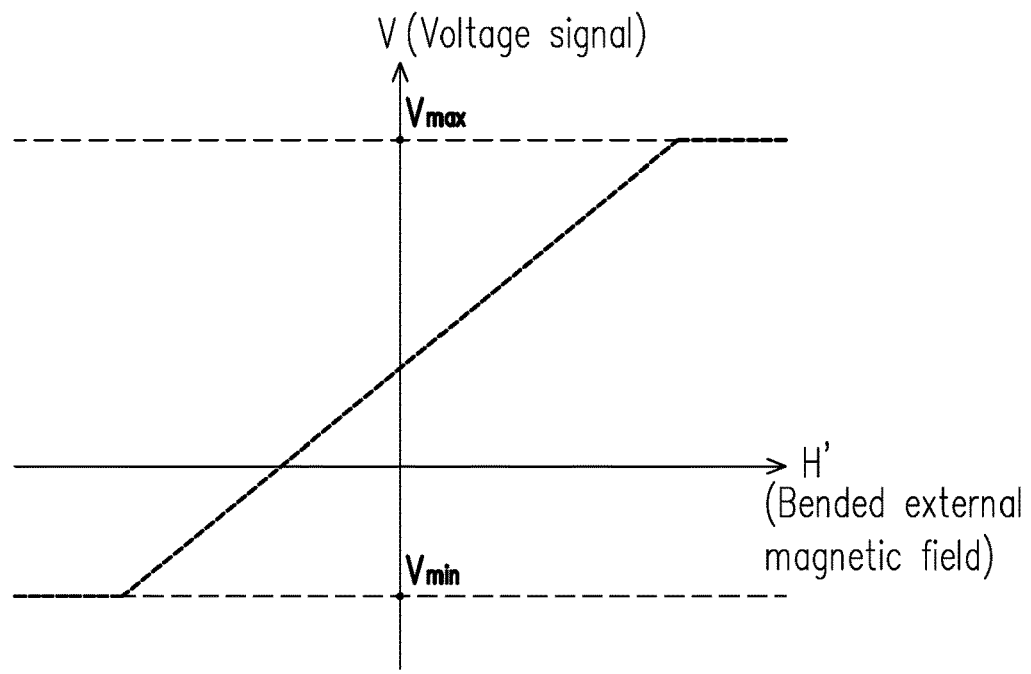
FIG. 5D is a diagram illustrating a relationship between a magnitude of an external magnetic field and a voltage signal output by a second Wheatstone bridge when the magnetic field sensing apparatus of FIG. 1 is placed in the external magnetic field of a second direction.

FIG. 5A to FIG. 5C are schematic diagrams of the magnetic field sensing apparatus of FIG. 1 placed in external magnetic fields of different directions in a second time interval. FIG. 5D is a diagram illustrating a relationship between a magnitude of an external magnetic field and a voltage signal output by a second Wheatstone bridge when the magnetic field sensing apparatus of FIG. 1 is placed in the external magnetic field of the second direction.

Referring to FIG. 5A to FIG. 5C, in the second time interval, the single direction magneto-resistive sensors 120 are coupled into a second Wheatstone bridge WH2 by the time division switching circuit 130. In detail, in the second Wheatstone bridge WH2, one end of the first single direction magneto-resistive sensor 1201 is connected to one end of the second single direction magneto-resistive sensor 1202, the other end of the first single direction magneto-resistive sensor 1201 is connected to one end of the fourth single direction magneto-resistive sensor 1204. One end of the third single direction magneto-resistive sensor 1203 is connected to the other end of the second single direction magneto-resistive sensor 1202, and the other end of the third single direction magneto-resistive sensor 1203 is connected to the other end of the fourth single direction magneto-resistive sensor 1204.

Then, in the following paragraphs, reactions of the second Wheatstone bridge WH2 in the external magnetic fields of different directions are substantially described according to the structure of the second Wheatstone bridge WH2.

Referring to FIG. 2A and FIG. 5A together, when the magnetic field sensing apparatus 100 is placed in the external magnetic field $H_{D1}$ with the magnetic field direction of the direction D1, a bended external magnetic field H' is formed due to a bending effect of the magnetic flux concentrator 110 on the magnetic lines of the external magnetic field $H_{D1}$. The first to fourth single direction magneto-resistive sensors 1201-1204 at different positions all sense the external magnetic field H' with the direction to the right. Therefore, the resistance values of the first to fourth single direction magneto-resistive sensors 1201-1204 sequentially generate changes of the positive ΔR, the positive ΔR, the negative ΔR, and the negative ΔR, where ΔR is greater than zero. Through the changes of the resistance values of the aforementioned single direction magneto-resistive sensors 120, the second Wheatstone bridge WH2 may output a voltage signal, but the voltage signal is a constant, in other words, the constant voltage signal is not changed along with increase or decrease of the external magnetic field $H_{D1}$, i.e., the second Wheatstone bridge WH2 cannot measure the magnetic field component in the direction D1.

Referring to FIG. 2B and FIG. 5B together, when the magnetic field sensing apparatus 100 is placed in the external magnetic field $H_{D2}$ with the magnetic field direction of the direction D2, a bended external magnetic field H' is formed due to a bending effect of the magnetic flux concentrator 110 on the magnetic lines of the external magnetic field $H_{D2}$. The first to fourth single direction magneto-resistive sensors 1201-1204 at different positions may sequentially sense the external magnetic field H' with directions to the left, right, right and left. Therefore, the resistance values of the first to fourth single direction magneto-resistive sensors 1201-1204 sequentially produce changes of the negative ΔR, the positive ΔR, the negative ΔR, and the positive ΔR, where ΔR is greater than zero. Through the changes of the resistance values of the aforementioned single direction magneto-resistive sensors 120, the second Wheatstone bridge WH2 may output another voltage signal (shown in FIG. 5D), according to FIG. 5D, it is learned that the another voltage signal is linearly distributed within a predetermined range of the external magnetic field $H_{D2}$. Within the predetermined range, a calculator (not shown) in the magnetic field sensing apparatus 100 may determine a magnitude and the positive and negative values of the external magnetic field $H_{D2}$ in the direction D2 according to the voltage signal.

Referring to FIG. 2C and FIG. 5C together, when the magnetic field sensing apparatus 100 is placed in the external magnetic field $H_{D3}$ with the magnetic field direction of the direction D3, a bended external magnetic field H' is formed due to a bending effect of the magnetic flux concentrator 110 on the magnetic lines of the external magnetic field $H_{D3}$. The first to fourth single direction magneto-resistive sensors 1201-1204 at different positions may sequentially sense the external magnetic field H' with directions to the left, left, right and left. Therefore, the resistance values of the first to fourth single direction magneto-resistive sensors 1201-1204 sequentially produce changes of the positive ΔR, the negative ΔR, the negative ΔR, and the positive ΔR, where ΔR is greater than zero. Through the changes of the resistance values of the aforementioned single direction magneto-resistive sensors 120, the second Wheatstone bridge WH2 may output still another voltage signal, but the still another voltage signal is a constant, in other words, the constant voltage signal is not changed along with increase or decrease of the external magnetic field $H_{D3}$, i.e., the second Wheatstone bridge WH2 cannot measure the magnetic field component in the direction D3.

According to the above description, in the second time interval, the time division switching circuit 130 may couple the single direction magneto-resistive sensors 120 into the second Wheatstone bridge WH1 to measure the magnetic field component of the external magnetic field in the second direction D2.

Figure 6A:
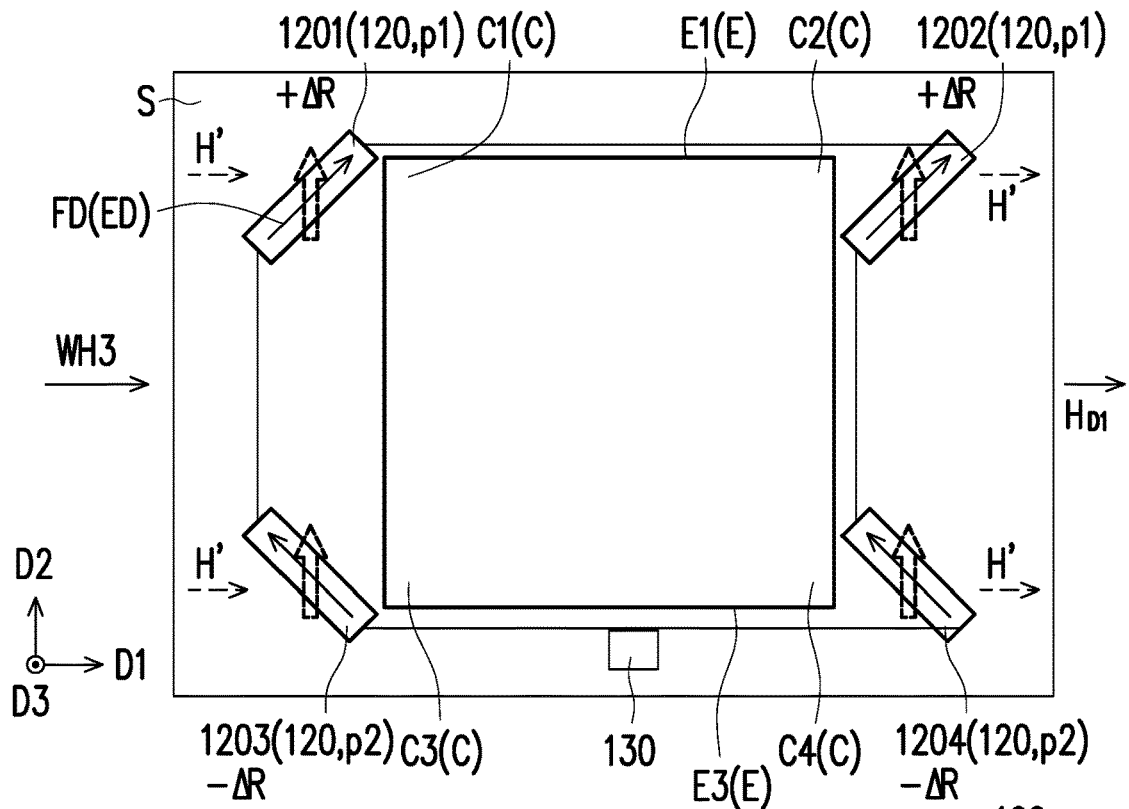
FIG. 6A to FIG. 6C are schematic diagrams of the magnetic field sensing apparatus of FIG. 1 placed in external magnetic fields of different directions in a third time interval.
Figure 6B:
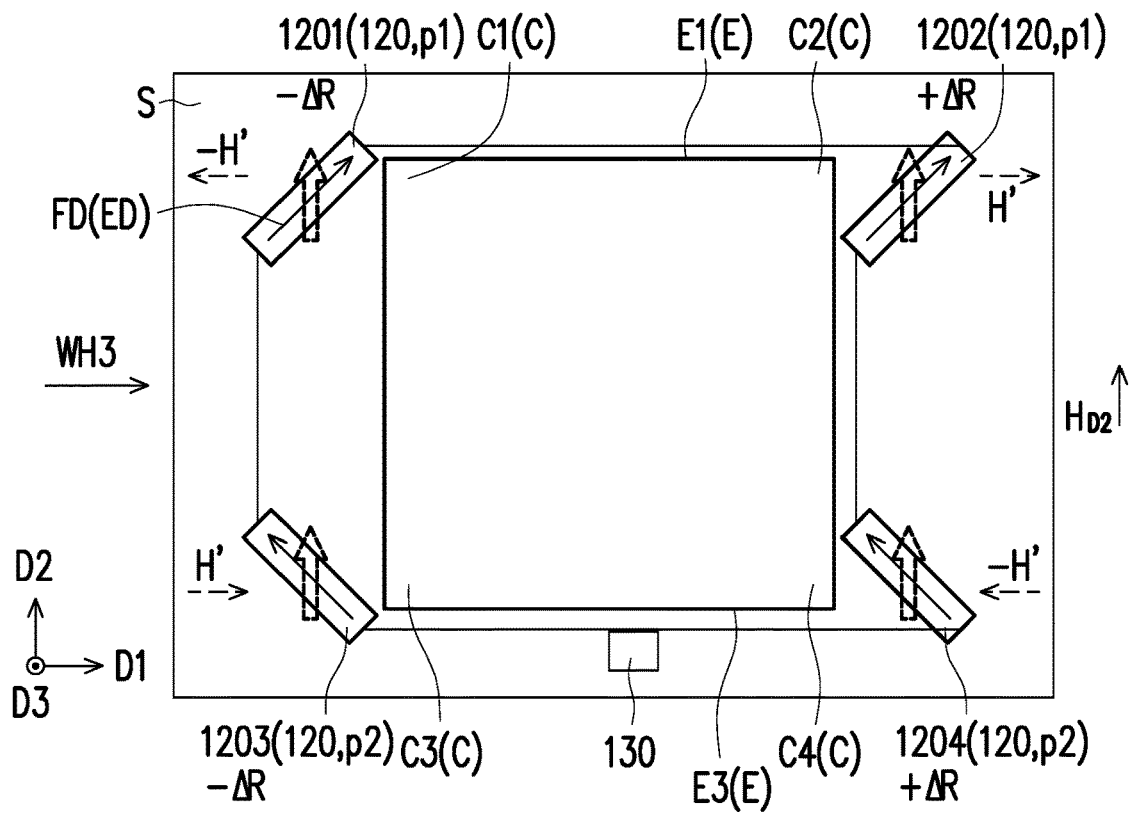
Figure 6C:
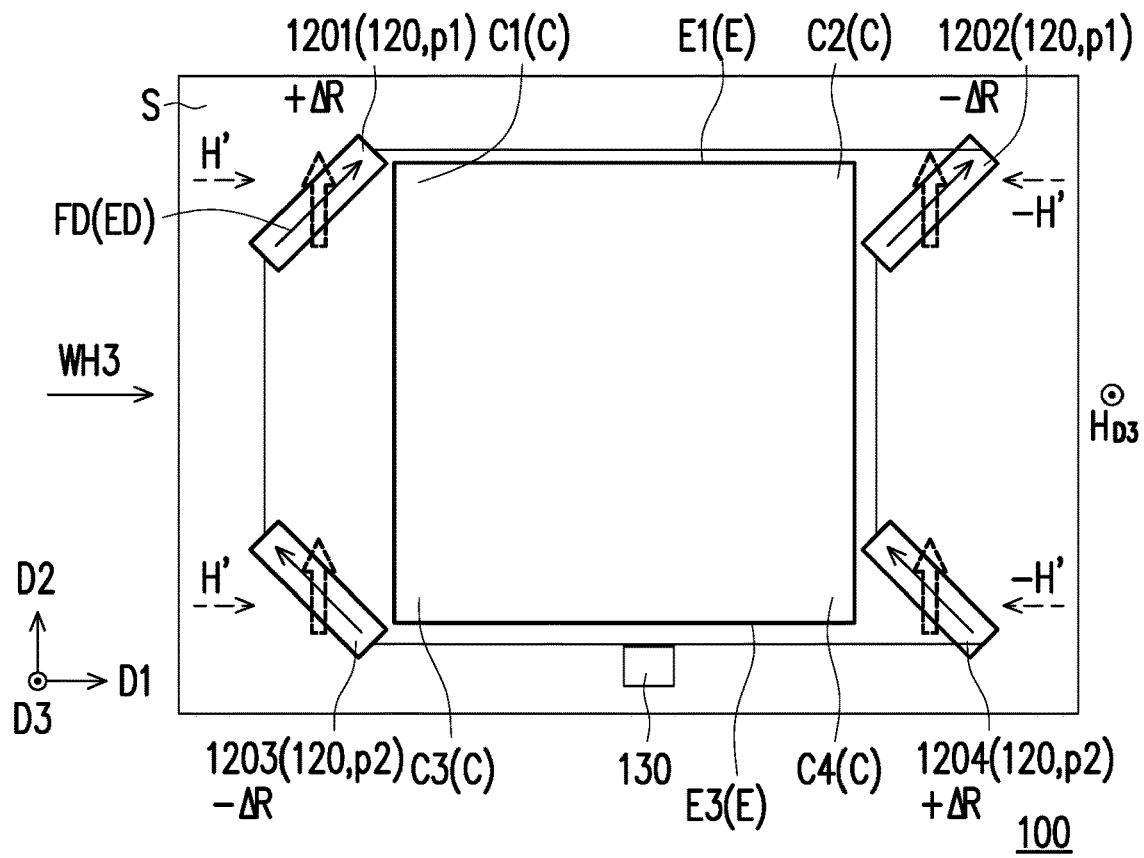
Figure 6D:
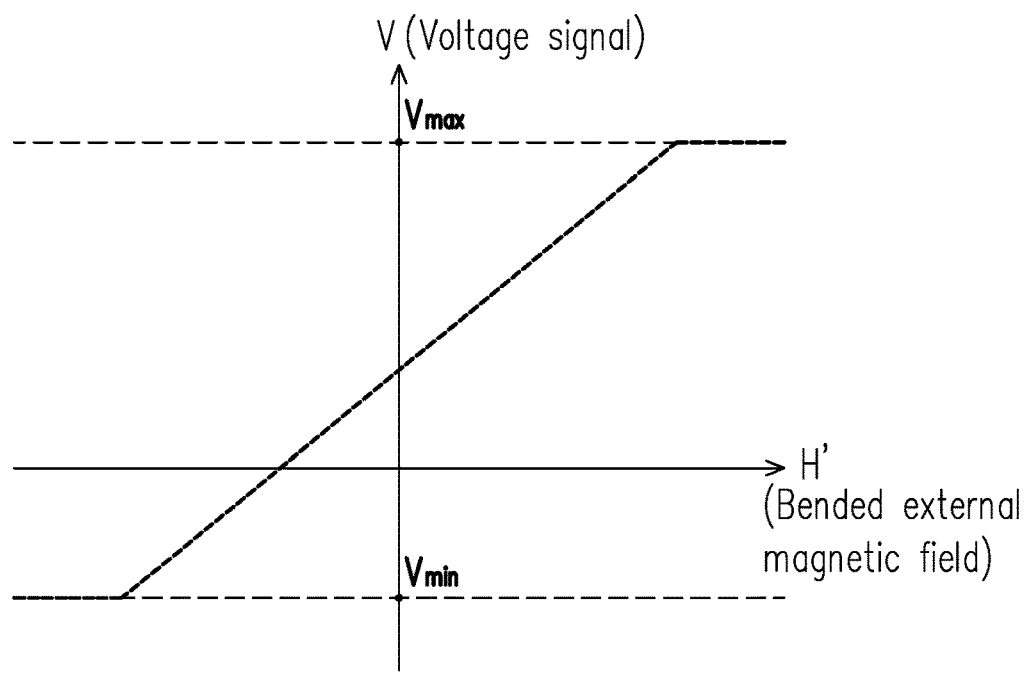
FIG. 6D is a diagram illustrating a relationship between a magnitude of an external magnetic field and a voltage signal output by a third Wheatstone bridge when the magnetic field sensing apparatus of FIG. 1 is placed in the external magnetic field of a third direction.

FIG. 6A to FIG. 6C are schematic diagrams of the magnetic field sensing apparatus of FIG. 1 placed in external magnetic fields of different directions in a third time interval. FIG. 6D is a diagram illustrating a relationship between a magnitude of an external magnetic field and a voltage signal output by a third Wheatstone bridge when the magnetic field sensing apparatus of FIG. 1 is placed in the external magnetic field of the third direction.

Referring to FIG. 6A to FIG. 6C, in the third time interval, the single direction magneto-resistive sensors 120 are coupled into a third Wheatstone bridge WH3 by the time division switching circuit 130. In detail, in the third Wheatstone bridge WH3, one end of the first single direction magneto-resistive sensor 1201 is connected to one end of the second single direction magneto-resistive sensor 1202, the other end of the first single direction magneto-resistive sensor 1201 is connected to one end of the third single direction magneto-resistive sensor 1203, and one end of the fourth single direction magneto-resistive sensor 1204 is connected to the other end of the second single direction magneto-resistive sensor 1202, and the other end of the fourth single direction magneto-resistive sensor 1204 is connected to the other end of the third single direction magneto-resistive sensor 1203.

Then, in the following paragraphs, reactions of the third Wheatstone bridge WH3 in the external magnetic fields of different directions are substantially described according to the structure of the third Wheatstone bridge WH3.

Referring to FIG. 2A and FIG. 6A together, when the magnetic field sensing apparatus 100 is placed in the external magnetic field $H_{D1}$ with the magnetic field direction of the direction D1, a bended external magnetic field H' is formed due to a bending effect of the magnetic flux concentrator 110 on the magnetic lines of the external magnetic field $H_{D1}$. The first to fourth single direction magneto-resistive sensors 1201-1204 at different positions all sense the external magnetic field H' with the direction to the right. Therefore, the resistance values of the first to fourth single direction magneto-resistive sensors 1201-1204 sequentially generate changes of the positive $\Delta R$, the positive $\Delta R$, the negative $\Delta R$, and the negative $\Delta R$, where $\Delta R$ is greater than zero. Through the changes of the resistance values of the aforementioned single direction magneto-resistive sensors 120, the third Wheatstone bridge WH3 may output a voltage signal, but the voltage signal is a constant, in other words, the constant voltage signal is not changed along with increase or decrease of the external magnetic field $H_{D1}$, i.e., the third Wheatstone bridge WH3 cannot measure the magnetic field component in the direction D1.

Referring to FIG. 2B and FIG. 6B together, when the magnetic field sensing apparatus 100 is placed in the external magnetic field $H_{D2}$ with the magnetic field direction of the direction D2, the first to fourth single direction magneto-resistive sensors 1201-1204 may sequentially sense the bended magnetic field components H' with directions to the left, right, right and left due to the bending effect of the magnetic flux concentrator 110 on the magnetic lines of the external magnetic field $H_{D2}$. Therefore, the resistance values of the first to fourth single direction magneto-resistive sensors 1201-1204 sequentially produce changes of the negative $\Delta R$, the positive $\Delta R$, the negative $\Delta R$, and the positive $\Delta R$, where $\Delta R$ is greater than zero. Through the changes of the resistance values of the aforementioned single direction magneto-resistive sensors 120, the third Wheatstone bridge WH3 may output another voltage signal, but the another voltage signal is a constant, in other words, the constant voltage signal is not changed along with increase or decrease of the external magnetic field $H_{D2}$, i.e., the third Wheatstone bridge WH3 cannot measure the magnetic field component in the direction D2.

Referring to FIG. 2C and FIG. 6C together, when the magnetic field sensing apparatus 100 is placed in the external magnetic field $H_{D3}$ with the magnetic field direction of the direction D3, a bended external magnetic field H' is formed due to a bending effect of the magnetic flux concentrator 110 on the magnetic lines of the external magnetic field $H_{D3}$. The first to fourth single direction magneto-resistive sensors 1201-1204 at different positions may sequentially sense the external magnetic field H' with directions to the right, left, right and left. Therefore, the resistance values of the first to fourth single direction magneto-resistive sensors 1201-1204 sequentially produce changes of the positive $\Delta R$, the negative $\Delta R$, the negative $\Delta R$, and the positive $\Delta R$, where $\Delta R$ is greater than zero. Through the changes of the resistance values of the aforementioned single direction magneto-resistive sensors 120, the third Wheatstone bridge WH3 may output still another voltage signal (shown in FIG. 6D), according to FIG. 6D, it is learned that the another voltage signal is linearly distributed within a predetermined range of the external magnetic field $H_{D3}$. Within the predetermined range, a calculator (not shown) in the magnetic field sensing apparatus 100 may determine a magnitude and the positive and negative values of the external magnetic field $H_{D3}$ in the direction D3 according to the voltage signal.

According to the above description, in the third time interval, the time division switching circuit 130 may couple the single direction magneto-resistive sensors 120 into the third Wheatstone bridge WH3 to measure the magnetic field component of the external magnetic field in the third direction D3.

According to the above description, in the magnetic field sensing apparatus 100 of the embodiment, since the pinning directions PD of the single direction magneto-resistive sensors 120 are all in the same direction, and the single direction magneto-resistive sensors 120 are disposed beside a plurality of the corners C of the magnetic flux concentrator 110, the magnetic flux concentrator 110 may bend the magnetic lines of the external magnetic fields $H_{D1}$, $H_{D2}$ and $H_{D3}$ of different directions, so that the single direction magneto-resistive sensors 120 may have different changes in resistance values in the external magnetic fields $H_{D1}$, $H_{D2}$ and $H_{D3}$ of different directions. Then, the time division switching circuit 130 may change junctions between the single direction magneto-resistive sensors 120 to switch different Wheatstone bridges WH1-WH3 in different time intervals, and the different Wheatstone bridges WH1-WH3 may output the voltage signals that have a linear relationship with the external magnetic fields in different directions according to the changes of the resistance values in the above different situations, and the magnetic field sensing apparatus 100 may respectively measure the magnetic field components of the external magnetic field in different directions according to the voltage signals with the linear relationship. Therefore, the magnetic field sensing apparatus 100 of the embodiment may implement three-axis sensing through the design of the single direction magneto-resistive sensors 120, which has simple manufacturing process, low cost and good stability. Since the lines of different Wheatstone bridges WH1-WH3 may stride over the magnetic flux concentrator 110 itself, the magnetic field sensing apparatus 100 may have a smaller volume.

It should be noted that a part of contents of the aforementioned embodiment is also used in the following embodiment, where descriptions of the same technical contents are omitted. The aforementioned embodiment may be referred for descriptions of components with the same names, and detailed descriptions thereof are not repeated in the following embodiment.

Figure 7:
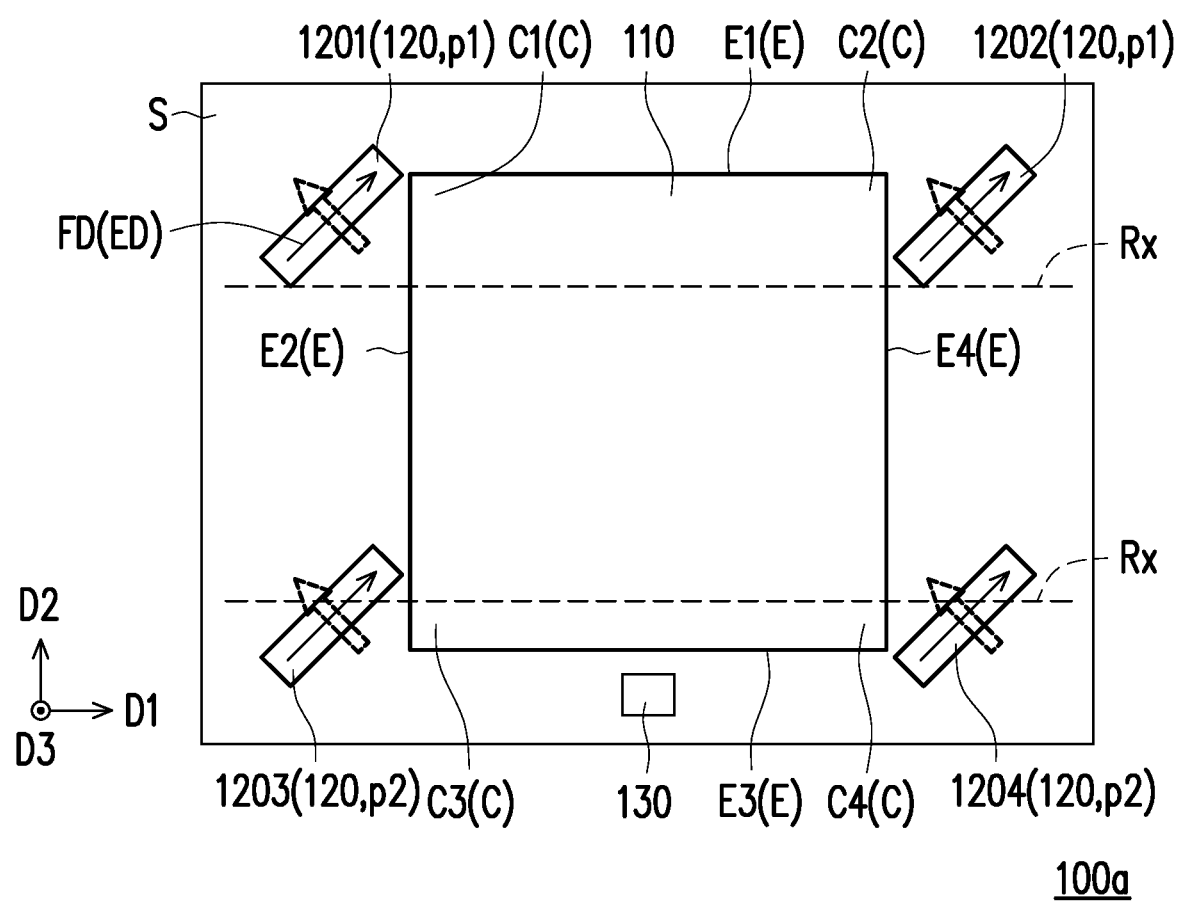
FIG. 7 is a schematic top view of a magnetic field sensing apparatus according to another embodiment of the disclosure.

FIG. 7 is a schematic top view of a magnetic field sensing apparatus according to another embodiment of the disclosure.

Referring to FIG. 7, a magnetic field sensing apparatus 100a of the embodiment of FIG. 7 is substantially similar to the magnetic field sensing apparatus 100 of FIG. 1, and a main difference there between is that: in the magnetic field sensing apparatus 100a, the axial directions of the easy magnetization axes FD of the single direction magneto-resistive sensors 120 are parallel to each other. In addition, in each of the single direction magneto-resistive sensors 120, the axial direction of the easy magnetization axis FD and the pinning direction PD are perpendicular to each other. In addition, the magnetic field sensing apparatus 100a of the embodiment may also adopt the circuit connection method similar to the aforementioned first to third Wheatstone bridges WH1-WH3 to measure the magnetic field components in different directions, which are not repeated.

Figure 8:
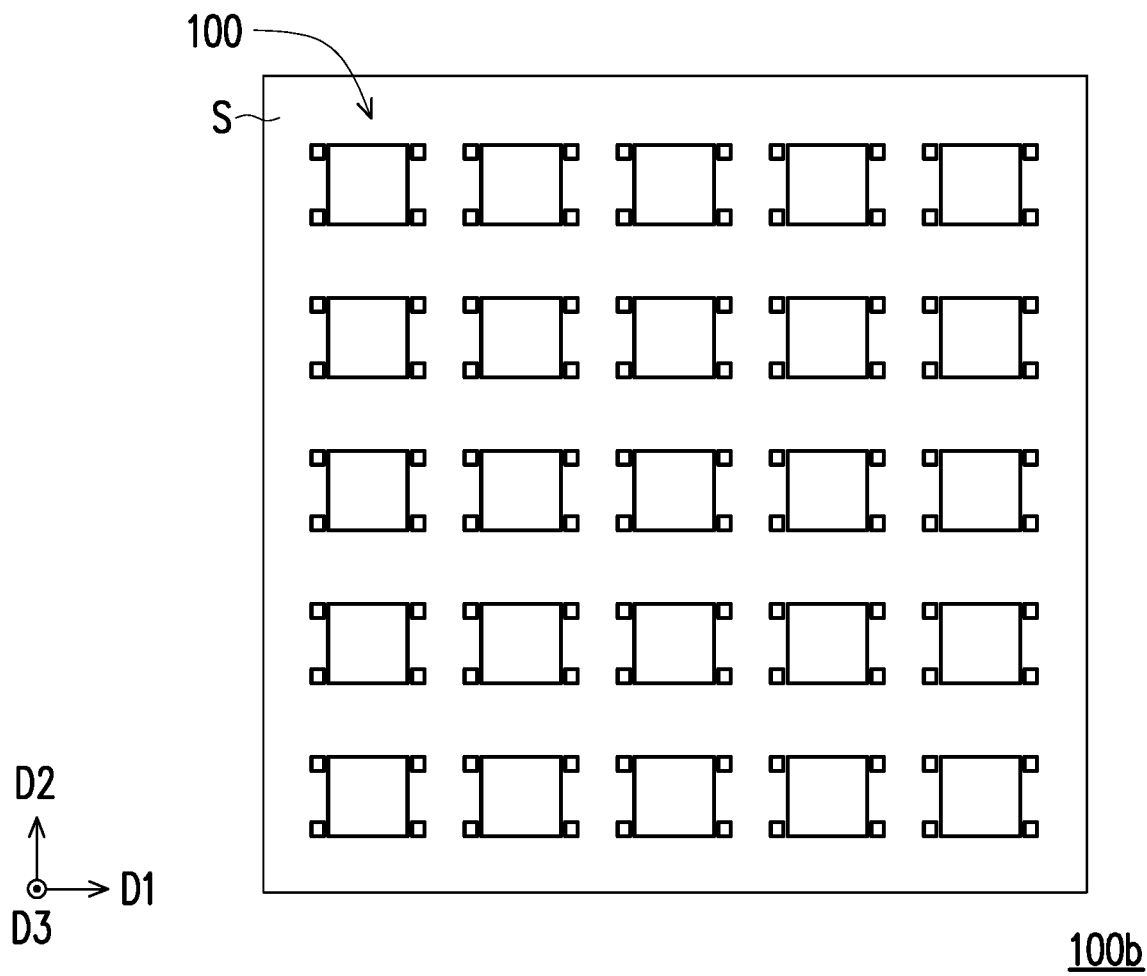
FIG. 8 is a simple schematic top view of a magnetic field sensing apparatus according to still another embodiment of the disclosure.

FIG. 8 is a simple schematic top view of a magnetic field sensing apparatus according to still another embodiment of the disclosure.

Referring to FIG. 8, a magnetic field sensing apparatus 100b of the embodiment of FIG. 8 is substantially similar to the magnetic field sensing apparatus 100 of FIG. 1, and a main difference there between is that: in the magnetic field sensing apparatus 100b, a plurality of the magnetic field sensing apparatuses 100a as shown in FIG. 1 are integrated on the substrate S.

Figure 9:
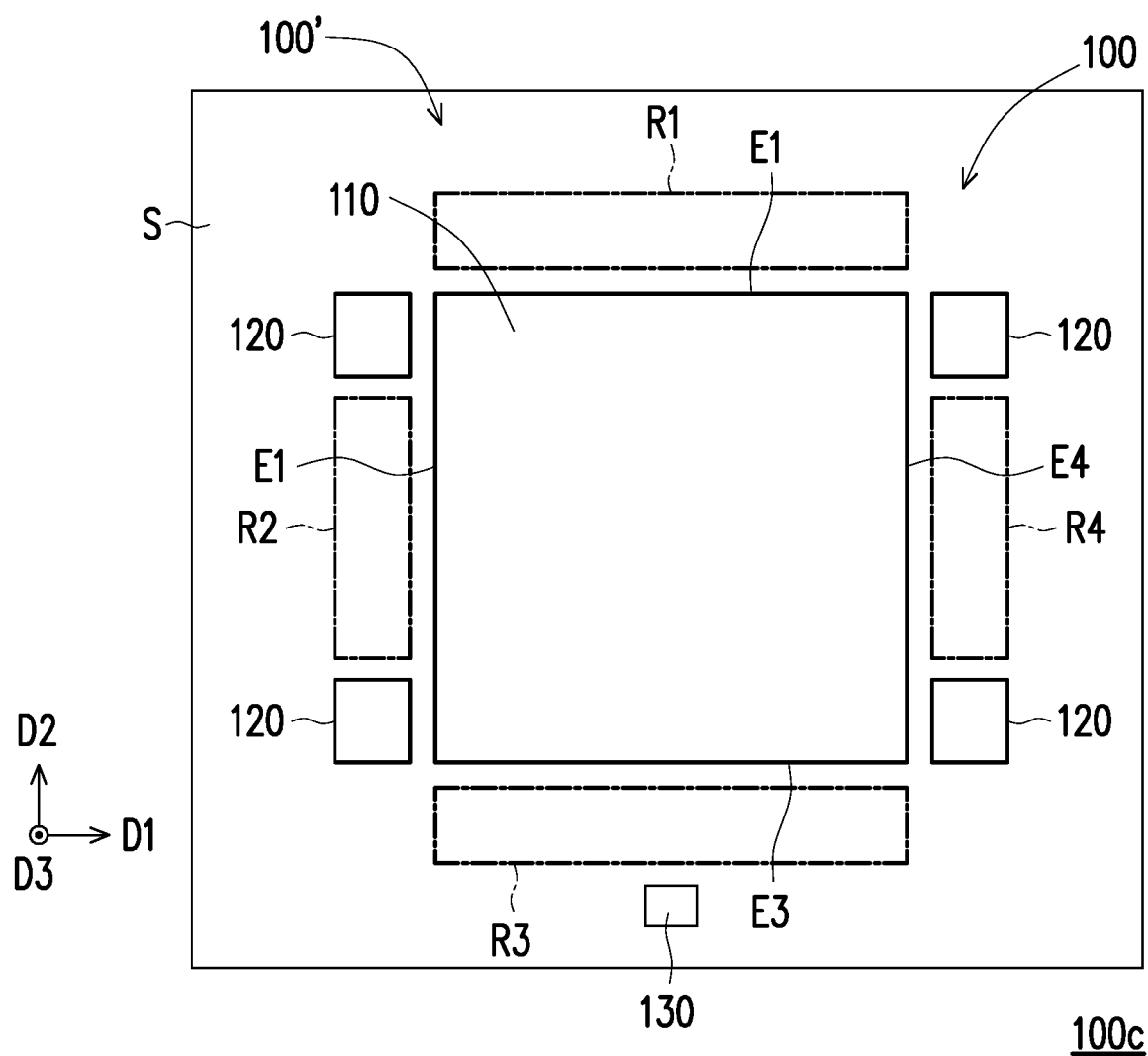
FIG. 9 is a simple schematic top view of a magnetic field sensing apparatus according to yet another embodiment of the disclosure.

FIG. 9 is a simple schematic top view of a magnetic field sensing apparatus according to yet another embodiment of the disclosure. For simplicity, the single direction magneto-resistive sensors 120 are shown in blocks.

Referring to FIG. 9, a magnetic field sensing apparatus 100c of the embodiment of FIG. 9 is substantially similar to the magnetic field sensing apparatus 100 of FIG. 1, and a main difference there between is that: the magnetic field sensing apparatus 100c includes the magnetic field sensing apparatus 100 as shown in FIG. 1 and a magnetic field sensing element 100', where a plurality of single direction magneto-resistive sensors (not shown) are provided in the magnetic field sensing element 100'. The circuit connection of the single direction magneto-resistive sensors 120 of the magnetic field sensing apparatus 100 is the same as the connection method of the second Wheatstone bridge as shown in FIG. 5A to FIG. 5C, so as to measure the magnetic field component in the second direction D2. Moreover, regions beside a first side ED1 and a third side ED3 of the magnetic flux concentrator 110 are respectively referred to as a first region R1 and a third region R3. Regions beside a second side ED2 and a fourth side ED4 of the magnetic flux concentrator 110 are respectively referred to as a second region R2 and a fourth region R4.

Based on the structure of FIG. 9, in the magnetic field sensing apparatus 100c of an embodiment, a part of the single direction magneto-resistive sensors (not shown) of the magnetic field sensing element 100' may be disposed in the second region R2, while another part of the single direction magneto-resistive sensors (not shown) may be disposed in the fourth region R4 to jointly construct a switchable Wheatstone bridge, and the circuit connection of the single direction magneto-resistive sensors in the Wheatstone bridge may be further switched by the time division switching circuit 130 to measure the magnetic field components in the first and third directions D1 and D3 in different time intervals.

Based on the structure of FIG. 9, in the magnetic field sensing apparatus 100c of another embodiment, a part of the single direction magneto-resistive sensors (not shown) of the magnetic field sensing element 100' may be disposed in the second region R2 (or the first region R1), while another part of the single direction magneto-resistive sensors (not shown) may be disposed in the fourth region R4 (or the third region R3) to respectively construct two Wheatstone bridges that are independent in circuit, so as to respectively measure the magnetic field components in the first and third directions D1 and D3.

Based on the structure of FIG. 9, in the magnetic field sensing apparatus 100c of still another embodiment, a part of the single direction magneto-resistive sensors (not shown) of the magnetic field sensing element 100' may be disposed in the first region R1, while another part of the single direction magneto-resistive sensors (not shown) may be disposed in the third region R3, the single direction magneto-resistive sensors of the magnetic field sensing element 100' may also be connected to the time division switching circuit 130, and the time division switching circuit 130 switches the circuit connection of the single direction magneto-resistive sensors to construct different Wheatstone bridges used for measuring the magnetic field components in the first direction D1 and the third direction D3 in different time intervals.

Based on the structure of FIG. 9, in the magnetic field sensing apparatus 100c of yet another embodiment, the single direction magneto-resistive sensors 120 in the magnetic field sensing apparatus 100 may construct the first and second Wheatstone bridges WH1 and WH2, and a part of the single direction magneto-resistive sensors of the magnetic field sensing element 100' may be disposed in the second region R2 (or the first region R1), while another part of the single direction magneto-resistive sensors may be disposed in the fourth region R4 (or the third region R3) to construct a Wheatstone bridge to measure the magnetic field component in the third direction D3.

Figure 10:
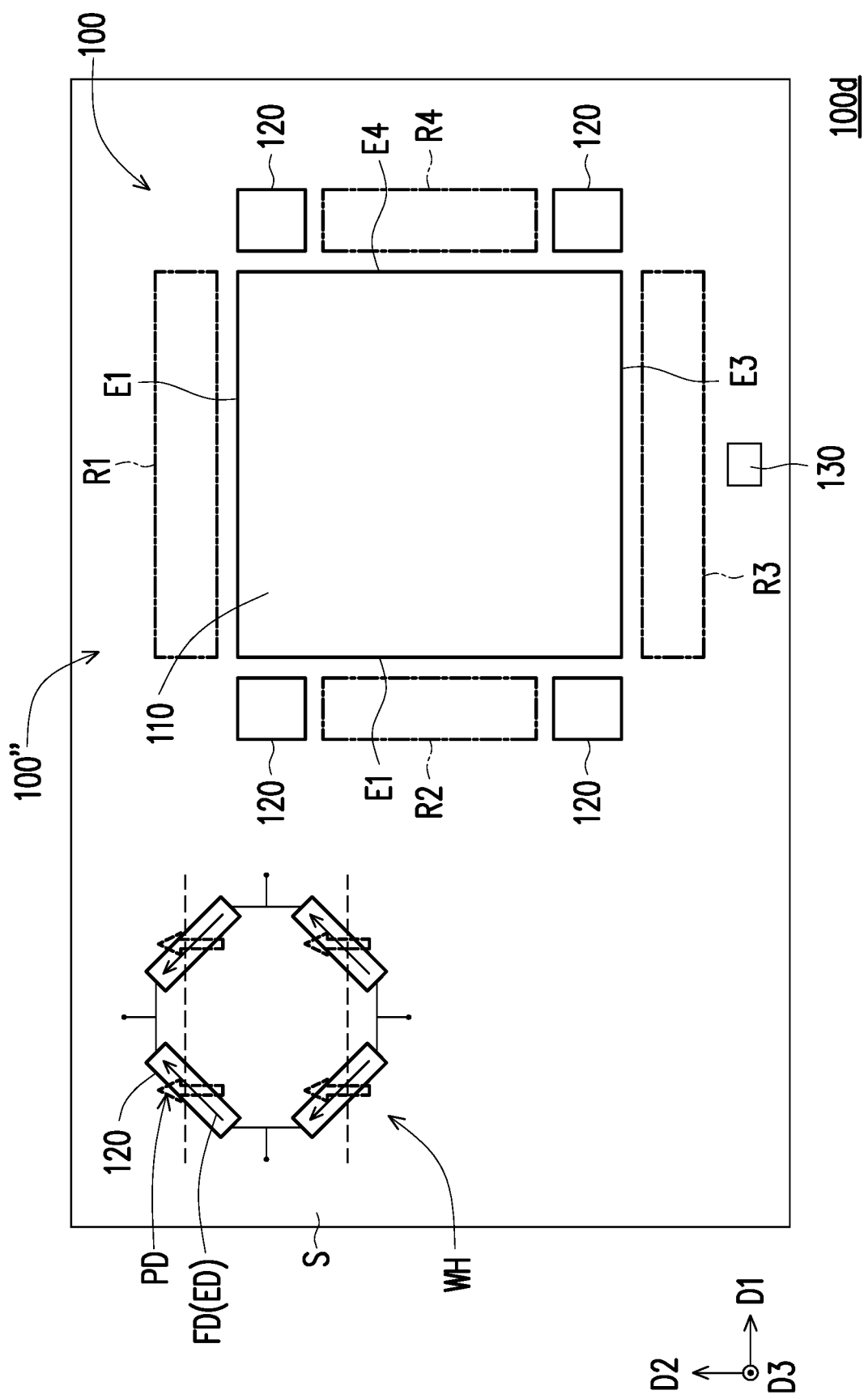
FIG. 10 is a simple schematic top view of a magnetic field sensing apparatus according to still another embodiment of the disclosure.

FIG. 10 is a simple schematic top view of a magnetic field sensing apparatus according to still another embodiment of the disclosure.

A magnetic field sensing apparatus 100d of FIG. 10 is similar to the magnetic field sensing apparatus 100c of the embodiment of FIG. 9, and a main difference there between is that: the magnetic field sensing apparatus 100d includes the magnetic field sensing apparatus 100 of FIG. 1, the magnetic field sensing element 100' and another magnetic field sensing element 100". The magnetic field sensing element 100" includes a plurality of the single direction magneto-resistive sensors 120 to construct a Wheatstone bridge WH, and included angles between the pinning directions PD of the single direction magneto-resistive sensors 120 therein and the easy magnetization axes FD are positive and negative 45 degrees.

Based on the structure of FIG. 10, in the magnetic field sensing apparatus 100d of an embodiment, the circuit connection of the single direction magneto-resistive sensors 120 in the magnetic field sensing apparatus 100 may be the second Wheatstone bridge WH2 for measuring the magnetic field component in the second direction D2. A part of the single direction magneto-resistive sensors of the magnetic field sensing element 100' may be disposed in the second region R2 (or the first region R1), while another part of the single direction magneto-resistive sensors may be disposed in the fourth region R4 (or the third region R3) to construct a Wheatstone bridge to measure the magnetic field component in the third direction D3.

Based on the structure of FIG. 10, in the magnetic field sensing apparatus 100d of another embodiment, the circuit connection of the single direction magneto-resistive sensors 120 in the magnetic field sensing apparatus 100 may be switched to the second and third Wheatstone bridges WH2 and WH3 by the time division switching circuit 130 for measuring the magnetic field components in the second and third directions D2 and D3. A part of the single direction magneto-resistive sensors of the magnetic field sensing element 100' may be disposed in the second region R2 (or the first region R1), while another part of the single direction magneto-resistive sensors may be disposed in the fourth region R4 (or the third region R3) to construct a Wheatstone bridge to measure the magnetic field component in the first direction D1.

In summary, in the magnetic field sensing apparatus of the embodiment of the disclosure, since the pinning directions of the single direction magneto-resistive sensors are all in the same direction, the magnetic field sensing apparatus has simple manufacturing process, low cost and good stability. Moreover, the time division switching circuit in the magnetic field sensing apparatus may couple the single direction magneto-resistive sensors located beside the corners of the magnetic flux concentrator into different Wheatstone bridges in different time intervals to measure magnetic field components of the external magnetic field in different directions. Since the lines of the different Wheatstone bridges may stride over the magnetic flux concentrator itself, the magnetic field sensing apparatus may have a smaller volume.

What is claimed is:

1. A magnetic field sensing apparatus, comprising:
a magnetic flux concentrator, having a plurality of corners;
a plurality of single direction magneto-resistive sensors, having a same pinning direction, and respectively disposed beside the plurality of corners, wherein a reference axis parallel to one side of the magnetic flux concentrator is defined, and a first acute angle is formed between easy magnetization axes of the plurality of single direction magneto-resistive sensors and the reference axis; and
a time division switching circuit, coupled to the plurality of single direction magneto-resistive sensors, and configured to switch at least a portion of junctions between the plurality of single direction magneto-resistive sensors within different time intervals to change a circuit connection between the plurality of single direction magneto-resistive sensors, so as to form different Wheatstone bridges in different time intervals to measure magnetic field components of an external magnetic field in different directions.

2. The magnetic field sensing apparatus as claimed in claim 1, wherein the axial directions of the easy magnetization axes of the plurality of single direction magneto-resistive sensors are parallel with each other.

3. The magnetic field sensing apparatus as claimed in claim 1, wherein the axial direction of the easy magnetization axis of the single direction magneto-resistive sensor is an extending direction of the single direction magneto-resistive sensor.

4. The magnetic field sensing apparatus as claimed in claim 1, wherein the first acute angle ranges between 20 degrees and 70 degrees.

5. The magnetic field sensing apparatus as claimed in claim 1, wherein a second acute angle is formed between the axial direction of the easy magnetization axis and the pinning direction.

6. The magnetic field sensing apparatus as claimed in claim 1, wherein the axial direction of the easy magnetization axis and the pinning direction are perpendicular to each other.

7. The magnetic field sensing apparatus as claimed in claim 1, wherein the single direction magneto-resistive sensors comprise giant magneto-resistive sensors or tunneling magneto-resistive sensors.

8. The magnetic field sensing apparatus as claimed in claim 1, wherein the magnetic flux concentrator comprises a plurality of sides, the plurality of sides comprise a first side, a second side, a third side, and a fourth side, the first side is opposite to the third side, and the second side is opposite to the fourth side, wherein
the first side is connected to the second side and the fourth side respectively to form a first corner and a second corner of the plurality of corners respectively; and
the third side is connected to the second side and the fourth side respectively to form a third corner and a fourth corner of the plurality of corners respectively,
wherein the first corner and the fourth corner are diagonal to each other, and the second corner and the third corner are diagonal to each other,
wherein the plurality of single direction magneto-resistive sensors further comprise a first single direction magneto-resistive sensor, a second single direction magneto-resistive sensor, a third single direction magneto-resistive sensor, and a fourth single direction magneto-resistive sensor,
wherein,
the first single direction magneto-resistive sensor is arranged beside the first corner;
the second single direction magneto-resistive sensor is arranged beside the second corner;
the third single direction magneto-resistive sensor is arranged beside the third corner; and
the fourth single direction magneto-resistive sensor is disposed beside the fourth corner.

9. The magnetic field sensing apparatus as claimed in claim 8, wherein the plurality of single direction magneto-resistive sensors are divided into a first portion and a second portion,
the first portion comprises two of the single direction magneto-resistive sensors located beside the first corner and the second corner, and axial directions of all of the easy magnetization axes thereof are parallel to each other;
the second portion comprises two of the single direction magneto-resistive sensors located beside the third corner and the fourth corner, and axial directions of all of the easy magnetization axes thereof are parallel to each other,
the axial directions of all of the easy magnetization axes in the first portion are a first axial direction,
the axial directions of all of the easy magnetization axes in the second portion are a second axial direction,
the first axial direction is not parallel with the second axial direction.

10. The magnetic field sensing apparatus as claimed in claim 8, wherein
in a first time interval,
the time division switching circuit connects one end of the first single direction magneto-resistive sensor to one end of the third single direction magneto-resistive sensor, connects another end of the first single direction magneto-resistive sensor to one end of the fourth single direction magneto-resistive sensor, and connects one end of the second single direction magneto-resistive sensor to another end of the third single direction magneto-resistive sensor, and connects another end of the second single direction magneto-resistive sensor to another end of the fourth single direction magneto-resistive sensor to form a first Wheatstone bridge, and the first Wheatstone bridge is configured to measure a magnetic field component of the external magnetic field in a first direction.

11. The magnetic field sensing apparatus as claimed in claim 8, wherein in a second time interval, the time division switching circuit connects one end of the first single direction magneto-resistive sensor to one end of the second single direction magneto-resistive sensor, connects another end of the first single direction magneto-resistive sensor to one end of the fourth single direction magneto-resistive sensor, and connects one end of the third single direction magneto-resistive sensor to another end of the second single direction magneto-resistive sensor, and connects another end of the third single direction magneto-resistive sensor to another end of the fourth single direction magneto-resistive sensor to form a second Wheatstone bridge, and the second Wheatstone bridge is configured to measure a magnetic field component of the external magnetic field in a second direction.

12. The magnetic field sensing apparatus as claimed in claim 8, wherein in a third time interval, the time division switching circuit connects one end of the first single direction magneto-resistive sensor to one end of the second single direction magneto-resistive sensor, connects another end of the first single direction magneto-resistive sensor to one end of the third single direction magneto-resistive sensor, and connects one end of the fourth single direction magneto-resistive sensor to another end of the second single direction magneto-resistive sensor, and connects another end of the fourth single direction magneto-resistive sensor to another end of the third single direction magneto-resistive sensor to form a third Wheatstone bridge, and the third Wheatstone bridge is configured to measure a magnetic field component of the external magnetic field in a third direction.

* * * * *